United States Patent [19]
Mizutani et al.

[11] Patent Number: 5,822,352
[45] Date of Patent: Oct. 13, 1998

[54] OPTICAL SEMICONDUCTOR APPARATUS, FABRICATION METHOD THEREOF, MODULATION METHOD THEREFOR, LIGHT SOURCE APPARATUS AND OPTICAL COMMUNICATION SYSTEM USING THE SAME

[75] Inventors: Natsuhiko Mizutani, Yokohama; Jun Nitta, Tokyo, both of Japan

[73] Assignee: Canon Kabushiki Kaisha, Japan

[21] Appl. No.: 931,938

[22] Filed: Sep. 17, 1997

Related U.S. Application Data

[63] Continuation of Ser. No. 616,199, Mar. 15, 1996, abandoned.

[30] Foreign Application Priority Data

Mar. 31, 1995 [JP] Japan ..................... 7-100602

[51] Int. Cl.$^6$ ............................. H01S 3/19; H01S 3/23
[52] U.S. Cl. ........................... 372/50; 372/46; 372/27
[58] Field of Search ....................... 372/50, 45, 46, 372/97, 26, 27

[56] References Cited

U.S. PATENT DOCUMENTS

| | | | |
|---|---|---|---|
| 4,785,457 | 11/1988 | Asbeck et al. | 372/45 |
| 5,157,544 | 10/1992 | Nitta | 359/344 |
| 5,309,268 | 5/1994 | Nakamura et al. | 359/154 |
| 5,309,275 | 5/1994 | Nishimura et al. | 359/344 |
| 5,414,549 | 5/1995 | Nishimura et al. | 359/160 |
| 5,699,373 | 12/1997 | Uchida et al. | 372/27 |

FOREIGN PATENT DOCUMENTS 2117190  5/1990  Japan .
5-63304  3/1993  Japan .

OTHER PUBLICATIONS

J.C. Dyment, et al., "Proton–Bombardment Formation of Stripe–Geometry Heterostructure Lasers for 300 K CW Operation", Proceedings of the IEEE, vol. 60, No. 6, pp. 726–728, Jun. (1972).

T. Ishikawa, et al., "LiNbO$_3$ Optical Waveguide Modulator for Bidirectional Transmission in Optical CATV Subscriber Systems," OCS 91–82, pp. 51–58 Mar. (1992).

Primary Examiner—James W. Davie
Attorney, Agent, or Firm—Fitzpatrick, Cella, Harper & Scinto

[57] ABSTRACT

An optical semiconductor apparatus includes a single substrate, at least two semiconductor laser portions each having a semiconductor laser structure and a current injection unit for independently injecting currents into the at least two semiconductor laser portions. The semiconductor laser portions are serially arranged on the substrate in a light propagation direction and respectively includes waveguides having active layers, and layer-extending planes of the waveguides partially overlap and are not parallel to each other. The electric-field directions of TE modes in the respective semiconductor laser portions are parallel to the layer-extending planes of the waveguides, so that the non-parallel layer-extending planes of the waveguides can establish non-parallel TE modes in the respective semiconductor laser portions. In such an integrated optical semiconductor apparatus, such as an integrated semiconductor laser apparatus and an integrated semiconductor optical amplifier apparatus, the polarization mode dependency of gain can be controlled by unevenly injecting current into the semiconductor laser portions whose TE modes are not parallel to each other.

31 Claims, 15 Drawing Sheets

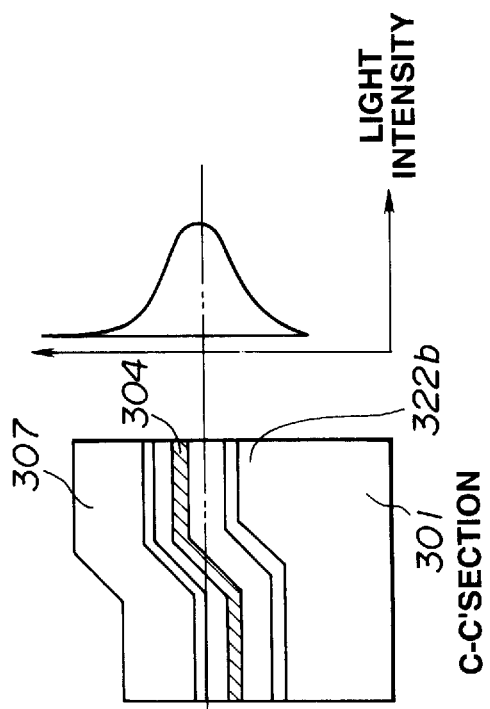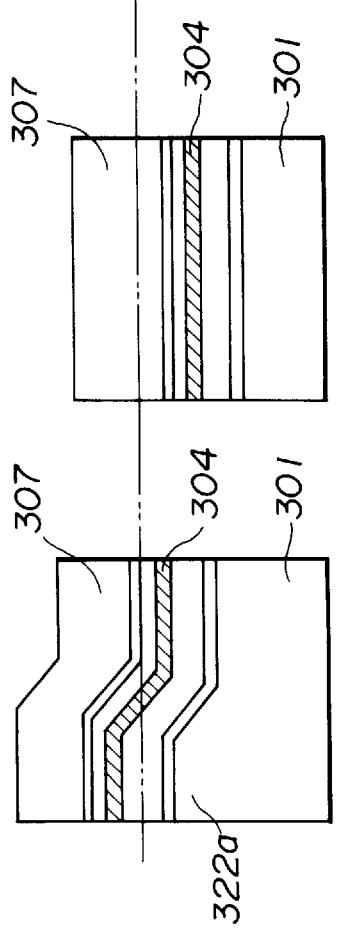

OPTICAL SEMICONDUCTOR APPARATUS, FABRICATION METHOD THEREOF, MODULATION METHOD THEREFOR, LIGHT SOURCE APPARATUS AND OPTICAL COMMUNICATION SYSTEM USING THE SAME

This application is a continuation of application Ser. No. 08/616,199 filed Mar. 15, 1996, now abandoned.

BACKGROUND OF THE INVENTION

1. Field of the Invention

The present invention relates to an optical semiconductor apparatus for use in the fields of optical communication systems and the like, such as oscillation polarization mode selective semiconductor lasers which can be driven by a direct modulation method with reduced dynamic wavelength fluctuation even during high-speed modulation operation and polarization-insensitive optical amplifiers which can substantially equally amplify any polarized light component. The present invention also relates to a fabrication method therefor, a modulation method for modulating or driving the optical semiconductor apparatus, a light source apparatus and an optical communication system which use the optical semiconductor apparatus as a transmitter, for example. More particularly, the present invention relates to an oscillation polarization mode selective semiconductor laser whose oscillation polarization mode can be switched between mutually-perpendicular polarization modes and which can suppress dynamic wavelength fluctuation even during high-speed modulation time and stably achieve high-density frequency or wavelength division multiplexing (FDM or WDM) optical communication, and the like.

2. Related Background Art

As an oscillation polarization mode selective dynamic single mode semiconductor laser, the following device has been developed and proposed. The oscillation polarization mode of the device has the structure that can be modulated by a digital signal which is produced by superposing a minute-amplitude digital signal on a bias injection current. The device is a distributed feedback (DFB) laser in which a distributed reflector of a grating is introduced into a semiconductor laser resonator or cavity and its wavelength selectivity is utilized. In the device, strain is introduced into an active layer of a quantum well structure, or the Bragg wavelength is located at a position shorter than a peak wavelength of a gain spectrum, so that gains for the transverse electric (TE) mode and the transverse magnetic (TM) mode are approximately equal to each other for light at wavelengths close to an oscillation wavelength, under a current injection condition near an oscillation threshold. Further, a plurality of electrodes are arranged and currents are unevenly injected through those electrodes. An equivalent refractive index of the cavity is unevenly distributed by the uneven current injection, and oscillation occurs in one of the TE mode and the TM mode and at a wavelength which satisfy a phase matching condition and take a minimum threshold gain. When the balance of the uneven current injection is slightly changed to vary a competitive relation of the phase condition, the oscillation polarization mode and wavelength of the device can be switched.

In that semiconductor device, an antireflection coating is provided on one end facet to asymmetrically employ effects of the uneven current injection between its output side and its modulation side. Alternatively, lengths of the electrodes are made different to introduce a structural asymmetry.

Furthermore, Japanese Patent Laid-Open No. 2-117190 discloses a semiconductor laser apparatus in which two semiconductor devices are arranged serially or in parallel. One of them principally oscillates or amplifies a wave in a predetermined polarization mode, and the other one chiefly oscillates or amplifies a wave in another polarization mode. Those devices are provided in a common layer or in parallel layers.

However, the above-discussed conventional oscillation polarization mode selective DFB semiconductor laser, which selects the oscillation polarization mode based on the phase condition, is sensitive to the phase at the end facet. As a result, the oscillation wavelength and polarization mode of the device depend on the current injection condition in a complicated fashion, and fluctuation in characteristics related to oscillation polarization mode and the like appears among individual devices. If antireflection coatings were provided on both end facets to solve those disadvantages, asymmetry in a light propagation direction of the device would be weakened and the effect of the uneven current injection would be reduced. Thus, stable switching of the oscillation polarization mode would be lost.

In the apparatus of Japanese Patent Laid-Open No. 2-117190, the oscillation or amplification of the wave in a predetermined polarization mode is performed by selecting a device's geometric shape, as a result of which yield is decreased depending on fluctuation in etched depth and ridge width that occurs during a ridge fabrication process.

Furthermore, in a fabrication process of a semiconductor laser device, the device or crystal is generally degraded during a process in which a wafer is exposed to atmosphere. Moreover, during repetitive crystal growth steps, a V-group element, whose vapor pressure is high, is likely to escape from a substrate surface when the substrate temperature is raised prior to crystal growth thereon, and hence crystal formation is degraded.

SUMMARY OF THE INVENTION

A first object of the present invention is to provide an optical semiconductor apparatus of an integrated type fabricated on a common substrate, such as a semiconductor laser apparatus, which can select an oscillation polarization mode by controlling its polarization mode dependency of gain, and an optical amplifier apparatus whose polarization mode sensitivity or dependency is reduced.

A second object of the present invention is to provide an optical semiconductor apparatus of the above-described type in which electric-field directions of TE modes in its semiconductor laser portions are readily regulated and those field directions differ from each other.

A third object of the present invention is to provide an optical semiconductor apparatus of the above-described type in which electric-field directions of TE modes in its semiconductor laser portions are readily determined by regulating inclinations of slant faces of slant portions on the substrate.

A fourth object of the present invention is to provide an optical semiconductor apparatus of the above-described type which can be fabricated by a simplified crystal growth method in which the number of crystal growths is decreased and the number of process steps wherein the wafer is exposed to atmosphere is reduced and in which its threshold is further lowered and maximum output and maximum oscillation temperature are improved.

A fifth object of the present invention is to provide an optical semiconductor apparatus of the above-described type, such as a semiconductor laser apparatus, in which its threshold is further lowered and maximum output and maximum oscillation temperature are improved by a current restraint structure.

A sixth object of the present invention is to provide an optical semiconductor apparatus of the above-described type which reduces scattering loss at end facets between the semiconductor laser portions.

A seventh object of the present invention is to provide an optical semiconductor apparatus of the above-described type which can operate in a dynamic single mode and act as a wavelength tunable laser.

An eighth object of the present invention is to provide a method for fabricating, with high productivity and yield, an optical semiconductor apparatus which is of an integrated type fabricated on a common substrate, such as a semiconductor laser apparatus which selects an oscillation polarization mode by controlling its polarization mode dependency of gain and an optical amplifier apparatus which oppresses its polarization mode dependency for incident light.

A ninth object of the present invention is to provide a method for fabricating, with high productivity and yield, an optical semiconductor apparatus of the above-described type in which a current restraint structure is formed by a single growth step during a process wherein waveguides including active layers of semiconductor laser portions are crystallographically grown.

A tenth object of the present invention is to provide a method for fabricating, with high productivity and yield, an optical semiconductor apparatus of the above-described type in which diffraction gratings are formed in respective semiconductor laser portions.

An eleventh object of the present invention is to provide an optical communication method in which an optical semiconductor apparatus of the above-described type is used as a transmitter.

A twelfth object of the present invention is to provide an optical communication system using an optical semiconductor apparatus of the above-described type as a transmitter.

A thirteenth object of the present invention is to provide a light source apparatus using an optical semiconductor apparatus of the above-described type.

The object of the present invention is achieved by the following optical semiconductor apparatuses, fabrication methods thereof, optical communication methods and systems, and a light source apparatus.

One aspect of the present invention for achieving the first object provides an optical semiconductor apparatus which includes a single substrate, at least two semiconductor laser portions (for example, two or three semiconductor laser portions formed on the substrate in a zigzag-patterned manner) each having a semiconductor laser structure and a current injection unit for independently injecting currents into the at least two semiconductor laser portions. The semiconductor laser portions are serially arranged on the substrate in a light propagation direction and respectively includes waveguides having active layers, and layer-extending planes of the waveguides partially overlap and are not parallel to each other. The electric-field directions of TE modes in the respective semiconductor laser portions are parallel to the layer-extending planes of the waveguides, so that the non-parallel layer-extending planes of the waveguides can establish non-parallel TE modes in the respective semiconductor laser portions. Thus, an integrated optical semiconductor apparatus, such as an integrated semiconductor laser apparatus and an integrated semiconductor optical amplifier apparatus, can be realized, in which the polarization mode dependency of gain can be controlled by unevenly injecting current into the semiconductor laser portions whose TE modes are not parallel to each other.

Another aspect of the present invention for achieving the second object provides an optical semiconductor apparatus wherein the substrate has a plurality of slant portions having different slant faces and the waveguides are respectively formed on the slant portions. In this structure, electric-field directions of the TE modes in the semiconductor laser portions are determined by the slant faces formed on the substrate.

Another aspect of the present invention for achieving the third object provides an optical semiconductor apparatus wherein the slant faces of the substrate are forward mesa surfaces of zinc blende type III–V semiconductor compound crystal. In this structure, the forward mesa faces, which can be exposed during their fabrication process with a good reproducibility, can serve as the slant faces of the substrate.

Another aspect of the present invention for achieving the fourth object provides an optical semiconductor apparatus in which the semiconductor laser portions respectively include current restraint structures for restraining currents into portions of the waveguides, and the current restraint structure includes a layer structure having a layer doped with an amphi-conductive impurity, and restrains the current into the portion of the waveguide on the slant face. More specifically, an Si-doped (Si is an amphi-conductive impurity) III–V semiconductor compound layer becomes p-type or n-type depending on orientations of an underlaid layer surface. This Si-doped layer exhibits p-type on a forward mesa face and n-type on a flat face. Thus, the Si-doped layer can act as an injection path of holes.

Another aspect of the present invention for achieving the fourth object provides an optical semiconductor apparatus in which the semiconductor laser portions respectively include current restraint structures for restraining currents into portions of the waveguides, and the current restraint structure includes a layer structure having a layer grown while simultaneously supplying n-type and p-type dopants, and restrains the current into the portion of the waveguide on the slant face. More specifically, when Se (an n-type dopant) and Zn (a p-type dopant) are simultaneously supplied, the layer exhibits p-type on a forward mesa face and n-type on a flat face. The thus-formed layer can act as an injection path of holes. This technique is described in Japanese Patent Laid-Open No. 5-63304.

Another aspect of the present invention for achieving the fourth object provides an optical semiconductor apparatus in which the semiconductor laser portions respectively include current restraint structures for restraining currents into portions of the waveguides, and the current restraint structure includes a layer structure formed by proton-bombardment, and restrains the current into the portion of the waveguide on the slant face. In this structure, resistance of a flat portion is raised by the proton-bombardment, and hence a slant face portion can serve as an injection path of electrons or holes.

Another aspect of the present invention for achieving the fourth object provides an optical semiconductor apparatus in which the substrate is a {100} GaAs substrate, and the forward mesa surface is a Ga-stabilized face. In this structure, the use of the GaAs substrate contributes to a low-threshold semiconductor laser apparatus. Since the {100} substrate is used and the Ga-stabilized face is exposed as a forward mesa face, the current restraint structure can be readily formed by a single growth, such as by using an amphi-conductive impurity and by simultaneously supplying p-type and n-type dopants.

Another aspect of the present invention for achieving the fourth object provides an optical semiconductor apparatus in which the Ga-stabilized face is a {111}A face. In this structure, since the {111}A face is a face of a low index number, the use of the {111}A face represses growth of a new facet face during the following growth process.

Another aspect of the present invention for achieving the fourth object provides an optical semiconductor apparatus in which the substrate is a {110} GaAs substrate, and the forward mesa surface, on which the waveguide is to be formed, is a {001} face. In this structure, since the forward mesa faces are two different {001} faces, directions of TE modes in different semiconductor laser portions formed on the different forward mesa faces are perpendicular to each other. As a result, selectivity of gain is improved in an integrated semiconductor laser apparatus, for example.

Another aspect of the present invention for achieving the fourth object provides an optical semiconductor apparatus in which the substrate is a {100} InP substrate, and the forward mesa surface is a {111}A face. Since the {100} substrate is used and the {111}A face is exposed as a forward mesa face, the current restraint structure can be readily formed by a single growth, such as by using an amphi-conductive impurity.

Another aspect of the present invention for achieving the fifth object provides an optical semiconductor apparatus in which the semiconductor laser portions respectively include current restraint structures for restraining currents into portions of the waveguides. When the current restraint structure formed on the slant face has a structure that can be formed by a single growth, the number of crystal growths during the fabrication process can be reduced.

Another aspect of the present invention for achieving the sixth object provides an optical semiconductor apparatus in which the semiconductor laser portions are separated from each other by a groove, and the groove separates an electrode of the current injecting unit into a plurality of portions as well. In this structure, the groove exposes opposed end facets between the semiconductor laser portions. As a result, scattering loss to be caused by a portion grown at the facet end can be reduced, and hence the threshold of an integrated optical semiconductor apparatus can be lowered, for example.

Another aspect of the present invention for achieving the sixth object provides an optical semiconductor apparatus in which the semiconductor laser portions are separated from each other by a groove, and a portion of the groove, through which oscillated laser light passes, is buried with a semiconductor compound layer which has a band gap energy larger than photon energy of the oscillated laser light. In this structure, the semiconductor compound layer in the groove can be formed by a single growth. Further, scattering loss to be caused by a portion grown at the end facet can be oppressed and reflection loss at the opposed end facets of the semiconductor laser portions can be reduced. Hence, the threshold of an integrated optical semiconductor apparatus can be lowered, for example.

Another aspect of the present invention for achieving the seventh object provides an optical semiconductor apparatus in which the semiconductor laser portions respectively include diffraction gratings. In this structure, the diffraction grating operates as a distributed feedback reflector for propagated light, and thus a semiconductor laser apparatus, that can operate as a dynamic single mode semiconductor laser, can be constructed.

Another aspect of the present invention for achieving the seventh object provides an optical semiconductor apparatus wherein the grating is formed solely on a flat portion of the semiconductor laser portion. In this structure, since the diffraction grating is formed on the flat face, the grating can be readily and accurately formed by a conventional method.

Another aspect of the present invention for achieving the eighth object provides a fabrication method for fabricating the above-described optical semiconductor apparatus which includes a step of forming at least two slant portions having different slant faces on the substrate and a step of crystallographically growing the waveguides of the semiconductor laser portions on the slant portions, respectively, and in which the crystallographical growing step includes a step of forming a current restraint structure for restraining current into a portion of the waveguide on the slant face, by a single crystallographical growth. In this fabrication method, the number of process steps and crystal growth steps can be reduced by forming the current restraint structure by a single crystal growth step. Further, the apparatus can be fabricated irrespective of fluctuation during the process, by making the TE modes of the laser portions not parallel by different orientations of the crystal faces.

Another aspect of the present invention for achieving the ninth object provides a method for fabricating the above-described optical semiconductor apparatus in which the step of forming the current restraint structure includes a step of crystallographically growing a layer doped with an amphi-conductive impurity. In this fabrication method, the current restraint structure can be formed by a single crystal growth.

Another aspect of the present invention for achieving the ninth object provides a fabrication method for fabricating the above-described optical semiconductor apparatus in which the step of forming the current restraint structure includes a step of crystallographically growing a layer while simultaneously supplying n-type and p-type dopants. In this fabrication method, the current restraint structure can be formed by a single crystal growth.

Another aspect of the present invention for achieving the ninth object provides a method for fabricating the above-described optical semiconductor apparatus in which the step of forming the current restraint structure includes a step of inactivating a grown layer by proton-bombardment. In this fabrication method, the current restraint structure can be formed by a single crystal growth.

Another aspect of the present invention for achieving the tenth object provides a method for fabricating the above-described optical semiconductor apparatus which includes a step of forming the diffraction grating on the substrate, a step of forming at least two slant portions having different slant faces on the substrate with the diffraction grating and a step of crystallographically growing the waveguides of the semiconductor laser portions on the slant portions, respectively. In this fabrication method, the diffraction grating can be accurately and readily formed on a flat face on the substrate.

Another aspect of the present invention for achieving the eleventh object provides an optical communication method for transmitting a signal from a transmitter to a receiver through an optical transmission line, which includes a step of modulating the polarization mode of light output from the above-described optical semiconductor apparatus between two mutually-perpendicular polarization modes by controlling current injected into the optical semiconductor apparatus, a step of selecting only the light output in one of the two mutually-perpendicular polarization modes to create an amplitude-modulated signal, and a step of transmitting the amplitude-modulated signal through the optical transmission line. In this communication method, current created by superposing a current, modulated based on a transmission signal, on a predetermined bias current, is supplied to the optical semiconductor apparatus, and the amplitude-modulated signal based on the transmission signal is picked out by, for example, a polarizer. Thus, the transmission signal is transmitted towards a receiver. As for the control of the current injected into the optical semiconductor apparatus, a constant bias current is injected into one of the semiconductor laser portions and a modulation current (which is based on the signal) is injected into the other of the semiconductor laser portions, or a first modulation current is injected into one of the semiconductor laser portions and a second modulation current (which is in anti-phase with the first modulation current) is injected into the other of the semiconductor laser portions, for example.

Another aspect of the present invention for achieving the eleventh object provides an optical communication method wherein the wavelength of the amplitude-modulated signal is tuned by controlling current injected into the optical semiconductor apparatus, and a signal at a desired wavelength is selectively detected by using a wavelength filter in the receiver.

Another aspect of the present invention for achieving the twelfth object provides an optical communication system for transmitting a signal from a transmitter to a receiver through an optical transmission line, which includes the above-described optical semiconductor apparatus provided in the transmitter, in which an output polarization mode of light is modulated between two-mutually perpendicular polarization modes by controlling current injected into the optical semiconductor apparatus, and a unit for selecting only the light output in one of the two-mutually perpendicular modes so as to create an amplitude-modulated signal which is to be transmitted from the transmitter to the receiver through the optical transmission line.

Another aspect of the present invention for achieving the twelfth object provides an optical communication system in which the optical semiconductor apparatus changes the wavelength of the amplitude-modulated signal, and which further includes a wavelength filter provided in the receiver for selectively detecting the signal at a desired wavelength.

Another aspect of the present invention for achieving the thirteenth object provides a light source apparatus which includes the above-described optical semiconductor apparatus, in which an output polarization mode of light is modulated between two mutually-perpendicular polarization modes by controlling current injected into the optical semiconductor apparatus, and a unit for selecting only the light output in one of the two mutually-perpendicular modes, such as a polarizer.

These advantages and others will be more readily understood in connection with the following detailed description of the preferred embodiments in conjunction with the drawings.

BRIEF DESCRIPTION OF THE DRAWINGS

FIG. 5A is a cross-sectional view taken along A–A' line of FIG. 4.

FIG. 5B is a cross-sectional view taken along B–B' line of FIG. 4.

FIG. 5C is a cross-sectional view taken along C–C' line of FIG. 4.

FIG. 5D is a graph illustrating an intensity profile of propagated light of the third embodiment.

DESCRIPTION OF THE PREFERRED EMBODIMENTS

First Embodiment

A first embodiment of the present invention, which is an AlGaAs/GaAs series semiconductor laser apparatus, will be described with reference to FIGS. 1A–1G. The device is fabricated in the following manner.

Figure 1A:
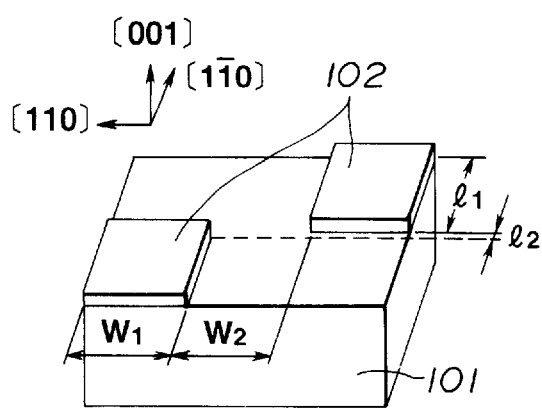
FIG. 1A is a perspective view illustrating a substrate coated with a zigzag-patterned resist mask of a first embodiment of an optical semiconductor apparatus according to the present invention.

Initially, a zigzag-patterned resist mask 102 is formed on a (001) n-type GaAs substrate 101 by an ordinary photolithography, as shown in FIG. 1A. Only a single laser apparatus is illustrated therein. The length $l_1$ of the mask 102 in a direction of [1$\bar{1}$0], which is a resonance or cavity direction of the laser apparatus, is in a range from several tens microns ($\mu$m) to several hundred microns ($\mu$m), and the interval $l_2$ between two portions of the resist mask 102 in the same direction is in a range from zero to several microns ($\mu$m). Alternatively, the length $l_1$ of the mask 102 in the direction of [1$\bar{1}$0] may be such that it creates an overlap of several microns ($\mu$m) between the two portions thereof. The width $w_1$ of the resist mask 102 in a direction of [110], which is a direction normal to the cavity direction of the device, is in a range from ten (10) $\mu$m to several hundred microns ($\mu$m), and the interval $w_2$ between the two portions of the mask 102 in the same direction is about 10 $\mu$m. The width $w_1$ of the mask 102 needs to have a value which guarantees electrical and optical separation between adjacent laser apparatuses. In FIG. 1A, the illustrated balance of those lengths and widths does not reflect an accurate relationship. In this embodiment, $l_1$ is 300 $\mu$m, $l_2$ is 10 $\mu$m, $w_1$ is 100 $\mu$m and $w_2$ is 6 $\mu$m.

Figure 1B:
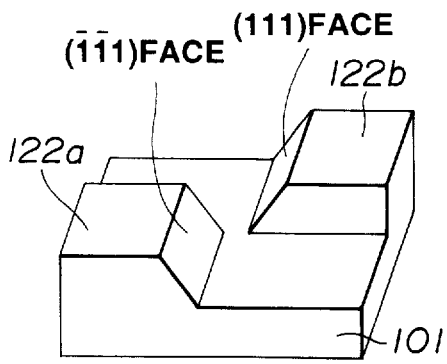
FIG. 1B is a perspective view illustrating the substrate having zigzag-patterned slant portions of the first embodiment.
Figure 1C:
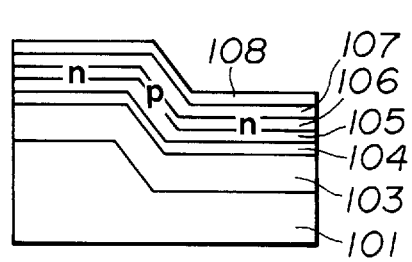
FIG. 1C is a cross-sectional view illustrating a layer structure of the first embodiment.

Then, wet etching is performed to form a pair of mesa steps 122a and 122b, which are staggered as shown in FIG. 1B. The etching depth is 1.8 $\mu$m, and slant faces of the steps 122a and 122b are respectively {111}A Ga-stabilized faces which incline by fifty-five (55) degrees from a (001) face. An etchant is Br-methanol. In this embodiment, an etchant of Br: methanol=1:20 (at 25° C.) is used. Any etchant may be used which is capable of forming a forward mesa as illustrated in FIG. 1B.

On the thus-formed substrate 101, laser structures are grown by a crystal growth method of CBE method, using alkyl compound of III-group and hydride of V-group as material gases. As a crystal growth method, MBE method, MOMBE method, GS-MBE method or the like may alternatively be used, using simple substances of Ga, Al, As, and so forth as part or all of III-group and V-group materials. Specifically, as shown in a cross section of FIG. 1C taken along the direction of [110], an Sn-doped n-type $Al_{0.6}Ga_{0.4}As$ lower clad layer 103 having a thickness of 1.5 $\mu$m, an active layer 104 of a quantum well structure, a Be-doped p-type $Al_{0.3}Ga_{0.7}As$ upper light guide layer 105 having a thickness of 0.15 $\mu$m, an Si-doped $Al_{0.3}Ga_{0.7}As$ carrier confining layer 106 having a thickness of 0.3 $\mu$m, a Be-doped p-type $Al_{0.6}Ga_{0.4}As$ clad layer 107, and a Be-doped p-type contact layer 108 are laid down on the substrate 101 in the named order. The active layer 104 having the quantum well structure consists of five pairs of intrinsic (i-) GaAs well layers (thickness: 6 nm) and i-$Al_{0.3}Ga_{0.7}As$ barrier layers (thickness: 10 nm).

Those layer thicknesses are those measured on a flat (001) surface, and thicknesses measured along directions perpendicular to the slant {111}A faces are shorter than the above values. This is because take-in rates of III-group and V-group elements vary depending on the inclinations of crystal faces. Also, the supply amount of a molecular beam, which is incident from a perpendicular direction, on the slant face per a unit area decreases proportional to cos θ (θ: the inclination angle of the slant face). In this connection, U.S. Pat. No. 4,785,457 discloses a semiconductor laser in which an active region is formed on a slant face of such a structure by current restraint using an amphi-conductive impurity.

The conductivity of the Si-doped $Al_{0.3}Ga_{0.7}As$ carrier confining layer 106 can be either of p-type and n-type conductivities depending on the face inclination of the underlying substrate 101. More specifically, the layer 106 doped with the amphi-conductive impurity of Si becomes an n-type AlGaAs on a flat (001) face and a p-type AlGaAs on a slant {111}A face. Since a Be-doped layer becomes a p-type layer irrespective of the crystal face inclination, most of the holes injected into the active layer 104 through a three-layer structure of the p-type light guide layer 105, the carrier confining layer 106 and the p-type AlGaAs clad layer 107 pass a {111}A face portion at least on the carrier confining layer 106 and are injected into a portion of the active layer 104 on the {111}A face through the light guide layer 105. Most of the holes, whose mobility is smaller than that of electrons, are injected into the portion of the active layer 104 on the slant face, so that laser oscillated light occurs here and a light output can be obtained.

Figure 1F:
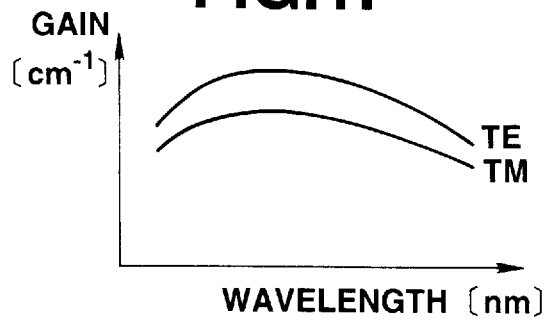
FIG. 1F is a graph illustrating the polarization mode dependency of gain of the first embodiment.
Figure 1D:
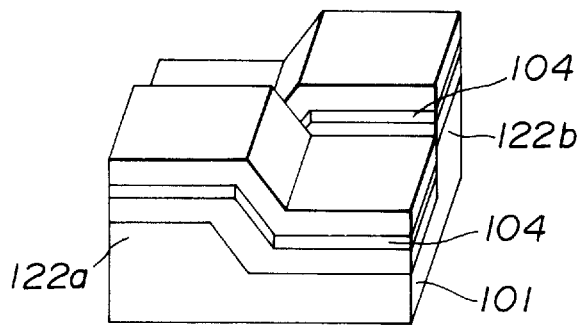
FIG. 1D is a perspective view illustrating the layer structure of the first embodiment.

As shown in FIG. 1D, the above-discussed growth is conducted on the zigzag slant faces. Thus, a structure is fabricated, in which quantum well layers on the slant faces each acting as the active layer 104 are serially arranged in the [1$\bar{1}$0] direction and the inclinations of those slant faces relative to the (001) surface are inverse to each other. Thus, layer-extending planes of the waveguide slant faces partially overlap, that is, intersect.

Figure 1E:
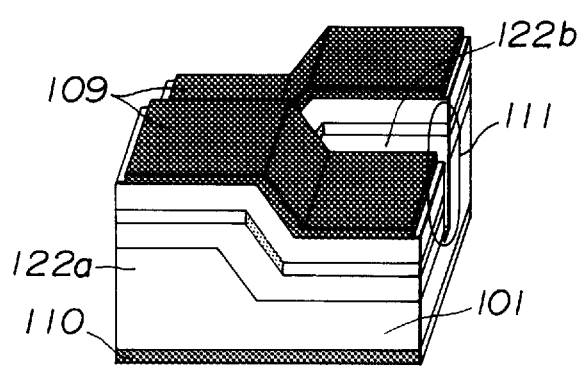
FIG. 1E is a perspective view illustrating the entire structure of the first embodiment.

Then, as shown in FIG. 1E, ohmic electrodes 109 and 110, which become current-injection paths, are deposited on upper and lower surfaces of the wafer, and a device separation groove 111 is formed between the two different slant faces along the [110] direction (i.e., the direction perpendicular to a principal axis of the laser cavity). The groove 111 has a width of 110 μm and reaches the GaAs substrate 101. The groove 111 not only separates the electrode 109 but remove facet-grown portions at end portions of the steps 122a and 122b, and hence scattering loss occurring between the two slant portions can be reduced. Further, both opposite end faces are cleaved. Distances from the separation groove 111 to the cleaved end facets are equal to each other (for example, 300 μm). Namely, the length $l_1$ is set to 300 μm to form such a structure.

Similar to an ordinary semiconductor laser, a polarization mode of a laser output light, whose electric field chiefly orients parallel to the {111}A face, is termed a TE mode, and a polarization mode of a laser output light, whose magnetic field principally orients parallel to the {111}A face, is named a TM mode. FIG. 1F illustrates wavelength dispersions of gains for the TE mode and the TM mode under conditions under which a laser portion having the active layer 104 on the slant face (one of the two portions on the slant faces which construct the above-discussed laser apparatus) is stimulated to 90% of its oscillation threshold. The gain for the TE mode is larger than that for the TM gain, similar to an ordinary quantum well laser.

Figure 1G:
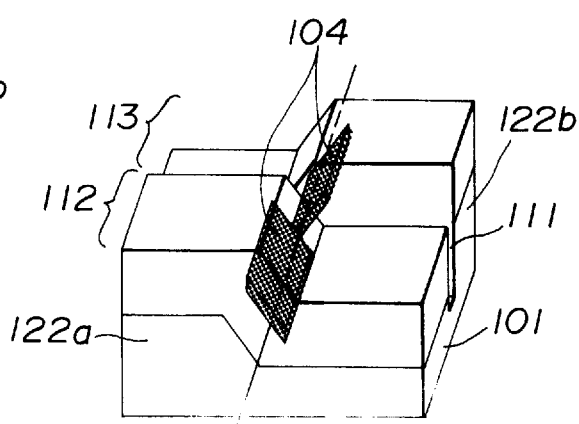
FIG. 1G is a perspective view illustrating the positional relation of two active layers of the first embodiment.

As illustrated in FIG. 1G, a compound cavity laser apparatus of this embodiment includes first and second cavity portions which respectively have different inclinations of the slant faces. Those cavity portions will hereinafter be called a front portion 112 and a rear portion 113, respectively. The {111}A faces of those front and rear portions 112 and 113 are inclined relative to each other by about 70 degrees, so that electric field directions of the TE mode, whose gains are large in the respective quantum well layers 104, are inclined relative to each other by 70 degrees between the front portion 112 and the rear portion 113. As a result, light in the TE mode in the front portion 112 is coupled more strongly to light in the TM mode in the rear portion 113 than to light in the TE mode in the rear portion 113, while light in the TM mode in the front portion 112 is coupled more strongly to light in the TE mode in the rear portion 113 than to light in the TM mode in the rear portion 113.

In this embodiment, the cavity lengths of the front and rear portions 112 and 113 are the same. In this structure, a condition will be changed, starting from a state in which current slightly larger than an oscillation threshold is uniformly injected into the front and rear portions 112 and 113, to a state in which a ratio of currents injected into the front and rear portions 112 and 113 is varied. When the current injected into the front portion 112 is made stronger than the current injected into the rear portion 113, the round-trip gain for the TE mode light in the front portion 112 increases and oscillation in the TE mode occurs. In contrast, when the current injected into the rear portion 113 is made greater than the current injected into the front portion 112 (i.e., the gain for the TE mode light in the rear portion 113 increases, and the thus-stimulated light contributes more to the TM mode rather than the TE mode in the front portion 112), the round-trip gain for the TM mode light in the front portion 112 increases and oscillation in the TM mode occurs. Thus, the polarization mode of oscillation light from the compound cavity laser apparatus of this embodiment can be modulated or switched by changing the ratio between currents injected into the front and rear portions 112 and 113.

Coupling loss between the front and rear portions 112 and 113 varies depending on the positional relation between the active layers 104 of the quantum well structure formed on the slant faces of the respective steps 122a and 122b. The front and rear portions 112 and 113 have been simultaneously grown by a single crystal growth (for example, a uniform growth is performed while rotating the substrate 101 and supplying a molecular beam along a direction approximately perpendicular to the substrate surface), and therefore, the positional alignment with respect to the direction perpendicular to the substrate surface is performed in a self-alignment manner if the growth is conducted using an ordinary CBE method, MBE method, GS-MBE method or MOMBE method. As for the positional alignment with respect to the [110] direction which is parallel to the substrate surface, an initial interval between the two slant faces formed on the substrate 101 and the grown layer thicknesses are controlled for that purpose. For example, the deviation in the slant face interval produced by photolithography during its fabrication process can be compensated by controlling the grown layer thicknesses. When such a structure is compared with the case where a plurality of LD wafers are separately fabricated and its module is built inclining the substrate surfaces relative to each other, a notably high coupling efficiency can be attained much more readily in this embodiment.

In this embodiment, the cavity lengths are the same between the front portion 112 and the rear portion 113, but such design is not necessary. Further, InGaAsP/InP series materials can also be used instead. For example, the following layer structure may be used.

On an n-type InP substrate which is etched using Br-methanol, an Sn-doped n-type $In_{0.86}Ga_{0.14}As_{0.31}P_{0.69}$ lower light guide layer having a thickness of 0.5 μm, an active layer of a quantum well structure, a Be-doped p-type $In_{0.73}Ga_{0.27}As_{0.59}P_{0.41}$ upper light guide layer having a thickness of 0.15 μm, an Si-doped $In_{0.86}Ga_{0.14}As_{0.31}P_{0.69}$ carrier confining layer having a thickness of 0.3 μm, a Be-doped p-type InP clad layer and a p-type $In_{0.59}Ga_{0.41}As_{0.9}P_{0.1}$ contact layer are laid down. The active layer consists of five pairs of i-$In_{0.53}Ga_{0.47}As$ well layers having a thickness of 6 nm and i-$In_{0.73}Ga_{0.27}As_{0.59}P_{0.41}$ barrier layers having a thickness of 10 nm. This modified example operates in the same manner as the first embodiment.

Second Embodiment

Figure 2A:
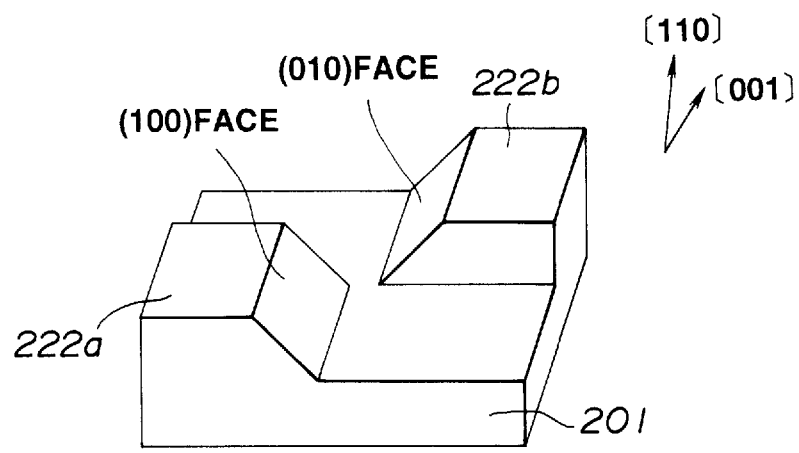
FIG. 2A is a perspective view illustrating a substrate having zigzag-patterned slant portions of a second embodiment of an optical semiconductor apparatus according to the present invention.
Figure 2B:
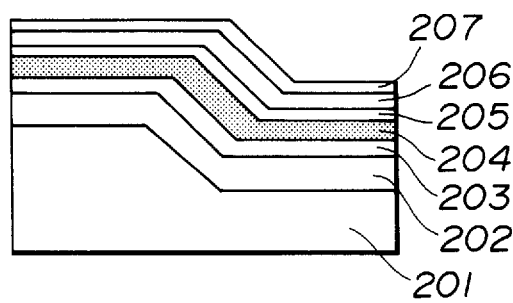
FIG. 2B is a cross-sectional view illustrating a layer structure of the second embodiment.
Figure 2C:
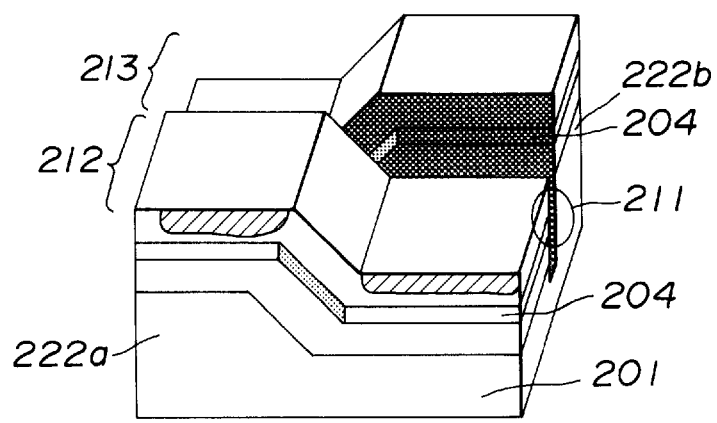
FIG. 2C is a perspective view illustrating the entire structure of the first embodiment.

A second embodiment of the present invention, which is an AlGaAs/GaAs series semiconductor laser apparatus, will be described with reference to FIGS. 2A–2C. FIG. 2A shows an n-type GaAs substrate 201 on which zigzag-patterned steps 222a and 222b are formed by wet etching in the same manner as the first embodiment. In the second embodiment, a (110) substrate is used as the substrate 201, and (100) and (010) faces are exposed at the respective slant faces of the steps 222a and 222b. The longitudinal or light-propagation direction of the cavity is a [001] direction.

The layer structure of this embodiment is as follows. As shown in FIG. 2B illustrating a cross section taken along a direction normal to the longitudinal direction, an Si-doped n-type AlGaAs lower clad layer 202, an Si-doped n-type AlGaAs lower light confining layer 203, an undoped AlGaAs/GaAs active layer 204 of a multiple quantum well structure, a Be-doped p-type AlGaAs upper light confining layer 205, a Be-doped p-type AlGaAs upper clad layer 206, and a Be-doped p-type GaAs contact layer 207 are laid down on the substrate 201 in the named order.

Then, the p-type GaAs layer 207 and the p-type AlGaAs upper clad layer 206 on the (110) faces are inactivated by a proton injection. Accordingly, holes injected towards the active layer 204 of the multiple quantum well structure are concentrated to portions thereof on the slant faces. In FIG. 2C, the proton-injected areas are hatched. The inactivation due to the proton injection is described in J. C. Dyment, et al., "Proton-Bombardment Formation of Stripe-Geometry Heterostructure Lasers for 300K CW Operation", Proc. IEEE, volume 60, pages 726–728 (1972), for example.

Similar to the first embodiment, ohmic electrodes are respectively formed on upper and lower surfaces, and a groove 211 for electrode separation is formed. End facets have {001} surfaces obtained by cleavage. FIG. 2C shows a perspective aspect of the laser apparatus of this embodiment (the electrodes are not shown). Since the orientations of crystal faces are different from those of the first embodiment, the Si-doped layer (Si is amphi-conductive impurity) exhibits n-type on both of the slant face and the flat face, and hence the Si-doped layer cannot form the current restraint structure. Therefore, the current restraint structure is formed by the inactivation due to the proton injection in the second embodiment.

Further, in the second embodiment, the slant faces are perpendicular to each other between a front portion 212 and a rear portion 213. This is different from the first embodiment. Accordingly, the ratio between a coupling intensity of the TE mode in the front portion 212 to the TE mode in the rear portion 213 and a coupling intensity of the TE mode in the front portion 212 to the TM mode in the rear portion 213 is the largest in the second embodiment, among the embodiments of the present invention. This advantage improves stability of the oscillation polarization mode of the polarization mode selective laser apparatus and reduces unfavorable influences of fluctuation caused during the fabrication process. Thus, a laser apparatus with a good reproducibility can be achieved. The operation of this embodiment is substantially the same as the first embodiment.

Third Embodiment

Figure 3A:
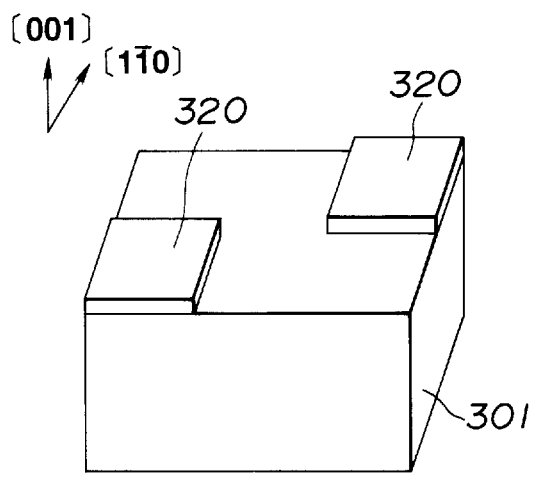
FIG. 3A is a perspective view illustrating a substrate coated with a zigzag-patterned resist mask of a third embodiment of an optical semiconductor apparatus according to the present invention.
Figure 3B:
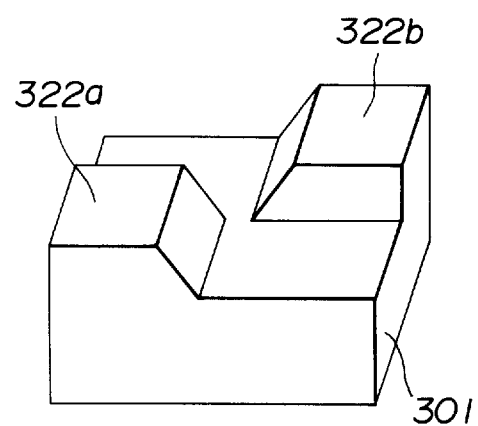
FIG. 3B is a perspective view illustrating the substrate having zigzag-patterned slant portions of the third embodiment.
Figure 3C:
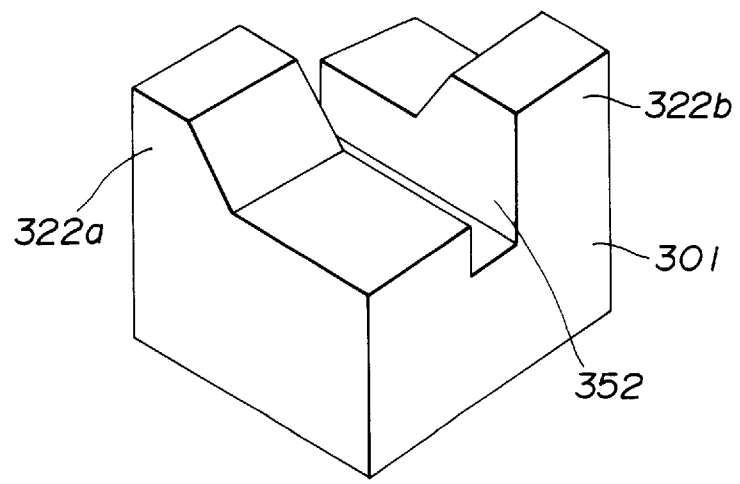
FIG. 3C is a perspective view illustrating the substrate in which a groove is formed between the two slant portions of the third embodiment.

A third embodiment of the present invention, which relates to an AlGaAs/GaAs series semiconductor laser apparatus, will be described with reference to FIGS. 3A–3C, FIG. 4, FIGS. 5A–5D and FIG. 6. FIG. 3A shows an n-type GaAs substrate 301 on which zigzag-patterned resist 320 is deposited by photolithography, similar to the first embodiment. FIG. 3B shows the substrate 301 on which zigzag-patterned steps 322a and 322b are formed by wet etching in the same manner as the first embodiment. Also similar to the first embodiment, a (001) substrate is used as the substrate 301, the cavity direction is a [1$\bar{1}$0] direction and {111}A surfaces are exposed at the respective slant surfaces of the steps 322a and 322b. A groove 352 having a depth of 3 μm and a width of 20 μm is formed by the combination of patterning by photolithography and dry etching. FIG. 3C shows a wafer with the groove 352 on which epitaxial growth is to be performed.

Figure 4:
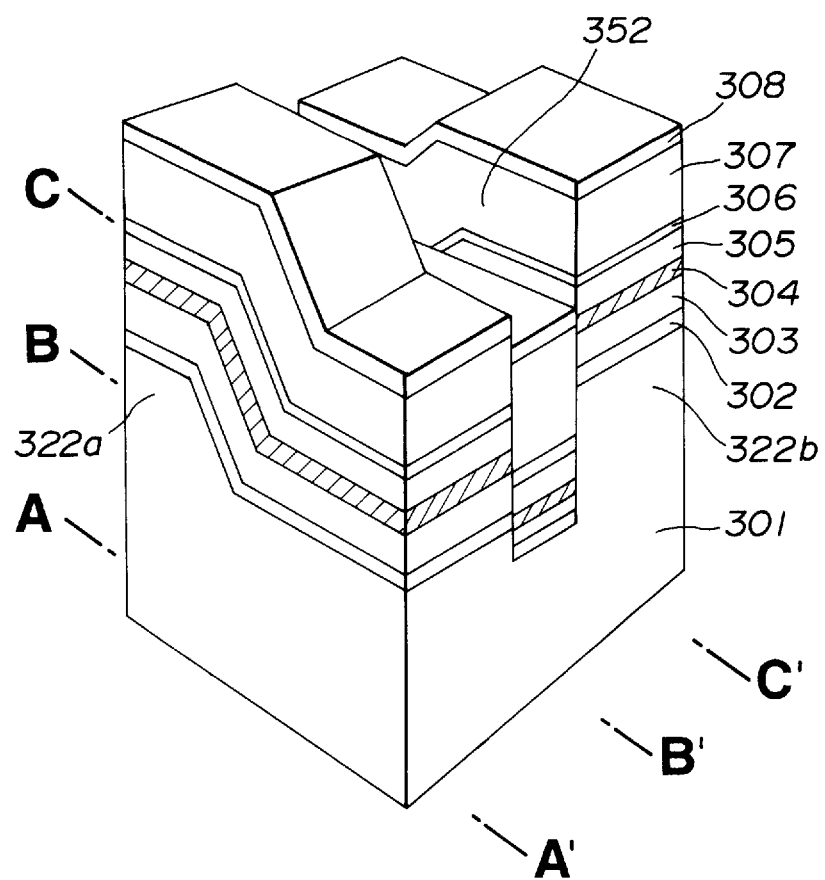
FIG. 4 is a perspective view illustrating the layer structure of the third embodiment.

On the wafer, laser structures are grown by a crystal growth method of CBE method, using alkyl compound of III-group and hydride of V-group as material gases. Specifically, as shown in FIG. 4, an Sn-doped n-type $Al_{0.6}Ga_{0.4}As$ lower clad layer 302 having a thickness of 1.0 μm, an Sn-doped n-type $Al_{0.3}Ga_{0.7}As$ lower light guide layer 303 having a thickness of 0.1 μm, an active layer 304 of a quantum well structure, a Be-doped p-type $Al_{0.3}Ga_{0.7}As$ upper light guide layer 305 having a thickness of 0.1 μm, an Si-doped $Al_{0.6}Ga_{0.4}As$ carrier confining layer 306 having a thickness of 0.3 μm, a Be-doped p-type $Al_{0.6}Ga_{0.4}As$ upper clad layer 307 having a thickness of 2.4 μm, and a Be-doped p-type GaAs contact layer 308 having a thickness of 0.3 μm are laid down in the named order. The active layer 304 having the quantum well structure consists of five pairs of intrinsic (i-) GaAs well layers (thickness: 6 nm) and $Al_{0.3}Ga_{0.7}As$ barrier layers (thickness: 10 nm).

FIGS. 5A–5D respectively illustrate cross-sections at the slant face portions 322a and 322b (A–A' line and C–C' line) and at the groove portion 352 (B–B' line). As illustrated in FIG. 5D, a dash and two-dotted line indicates an intensity peak of propagated light at the groove portion 352. At the groove portion 352 (B–B' line section), light incident thereon from the slant face portions 322a and 322b is transmitted mainly through the clad layer 307, and the quantum well layer 304, which has a strong absorptive capability, is located at a place where the light intensity is weak. Thus, light loss is small even though the groove 352 is introduced. No light confining structure exists in a lateral direction, which is normal to the light propagation direction, at the groove portion 352, so that the propagation mode at the groove portion 352 takes a mode of a slab waveguide.

Figure 6:
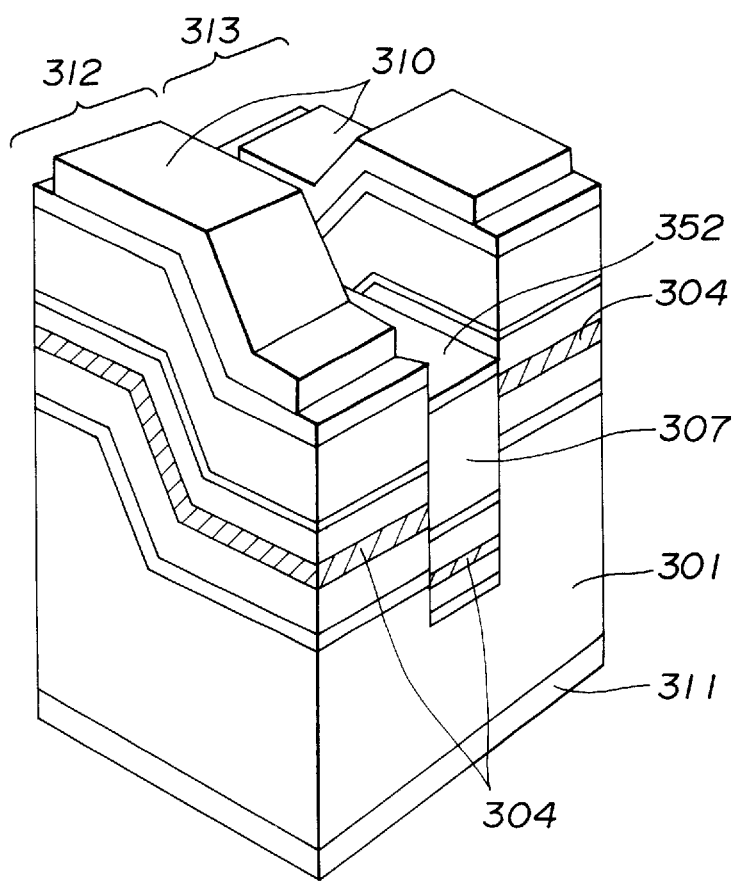
FIG. 6 is a perspective view illustrating the entire structure of the third embodiment.

Then, as shown in FIG. 6, ohmic electrodes 310 and 311, which become current-injection paths, are deposited on upper and lower surfaces of the wafer, and the upper electrode 310 is separated by the groove portion 352. Similar to the first embodiment, the oscillation polarization mode switching is performed by unevenly injecting current into a front portion 312 and a rear portion 313. If another electrode (not shown) is formed on the groove portion 352, current can also be injected into the upper clad layer 307 at the groove portion 352 and the groove portion 352 can be used as a phase control region between the front portion 312 and the rear portion 313.

Fourth Embodiment

Figure 7A:
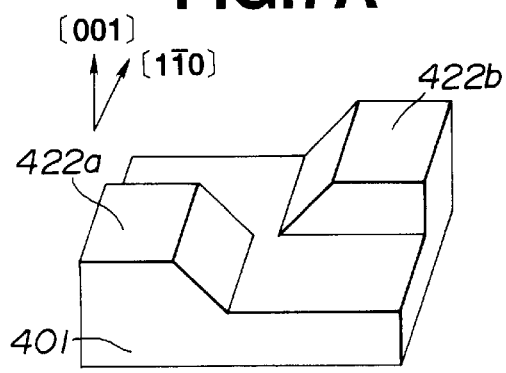
FIG. 7A is a perspective view illustrating a substrate having zigzag-patterned slant portions of a fourth embodiment of an optical semiconductor apparatus according to the present invention.
Figure 7B:
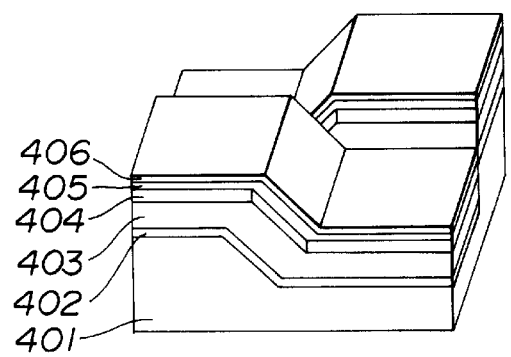
FIG. 7B is a perspective view illustrating a layer structure of the fourth embodiment after a first growth process.

A fourth embodiment of the present invention, which relates to an AlGaAs/GaAs series DFB semiconductor laser apparatus, will be described with reference to FIGS. 7A–7D. FIG. 7A shows an n-type GaAs substrate 401 on which zigzag-patterned steps 422a and 422b are formed by photolithography and wet etching, similar to the above embodiments. Similar to the third embodiment, a (001) substrate 401 is used, the cavity direction is a [1$\bar{1}$0] direction and {111}A faces are exposed at the respective slant faces of the steps 422a and 422b. FIG. 7B shows a laser structure attained after a first growth is finished. An Sn-doped n-type $Al_{0.6}Ga_{0.4}As$ lower clad layer 402 having a thickness of 1.0 μm, an Sn-doped n-type $Al_{0.3}Ga_{0.7}As$ lower light confining layer 403 having a thickness of 0.1 μm, an active layer 404 of a quantum well structure, a Be-doped p-type $Al_{0.3}Ga_{0.7}As$ upper light confining layer 405 having a thickness of 0.1 μm, and a Be-doped p-type $Al_{0.5}Ga_{0.5}As$ carrier confining layer 406 having a thickness of 0.2 μm are deposited on the substrate 401.

Figure 7C:
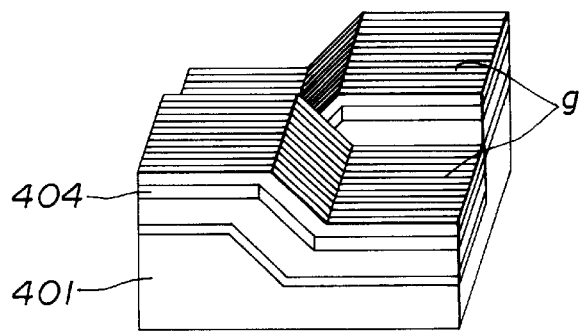
FIG. 7C is a perspective view illustrating a diffraction grating of the fourth embodiment.
Figure 7D:
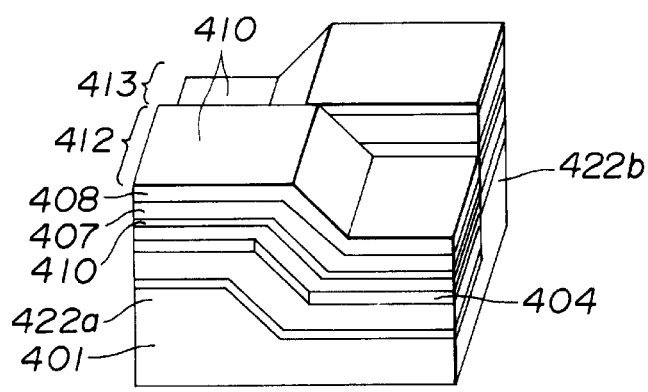
FIG. 7D is a perspective view illustrating the entire structure of the fourth embodiment.

Then, a grating pattern is formed on the wafer using a two-beam interference exposure method, and a grating g is formed by dry etching. The grating pitch is 240 nm. FIG. 7C illustrates a perspective aspect of the thus-formed wafer. Then, a second crystal growth is performed again, and a Be-doped p-type $Al_{0.3}Ga_{0.7}As$ upper light guide layer 410 having a thickness of 0.2 μm, a Be-doped p-type $Al_{0.6}Ga_{0.4}As$ upper clad layer 407 having a thickness of 1.4 μm, and a Be-doped p-type GaAs contact layer 408 having a thickness of 0.3 μm are laid down on the wafer, as illustrated in FIG. 7D.

Then, the p-type GaAs layer and the p-type AlGaAs layer formed on the (001) faces are made highly resistive by a proton injection, and thus holes injected towards the active layer 404 of the multiple quantum well structure are caused to concentrate to a portion thereof on the slant face portions 422a and 422b (the proton-injected portions are not shown).

Similar to the third embodiment, ohmic electrodes are deposited on upper and lower surfaces of the wafer (not shown), and a groove is formed for electrode separation (not shown). End facets of (001) faces are made by cleavage. Further, antireflection coatings are provided on the cleaved end facets to reduce reflection thereat (not shown).

Similar to the first embodiment, the oscillation polarization mode switching is performed by unevenly injecting current into a front portion 412 and a rear portion 413. In the fourth embodiment, both the polarization mode dependency of gains and the polarization mode dependency of Bragg wavelength due to polarization mode dependency of effective refractive index in the front portion 412 and the rear portion 413 contribute to selection of the oscillation polarization mode. Behavior of oscillation polarization mode and wavelength of the device in an uneven biased state is generally complicated. In this embodiment, however, since the grating g is formed, the following technical advantages are attained. The line width of oscillation wavelength is narrowed. Oscillation wavelength is notably stabilized. Wavelength tuning can be readily performed as a wavelength tunable laser apparatus.

Fifth Embodiment

Figure 8A:
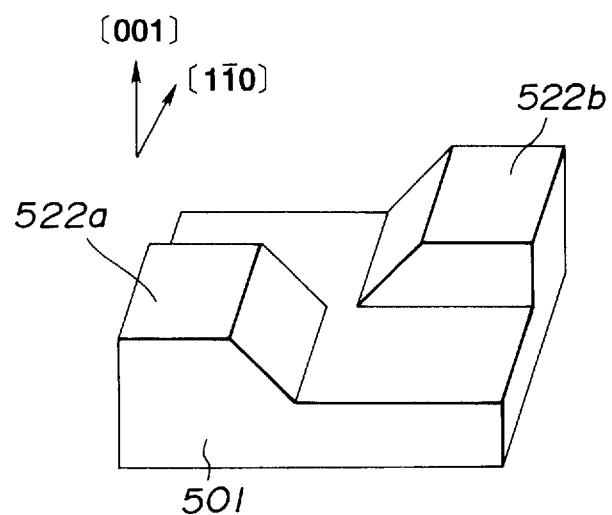
FIG. 8A is a perspective view illustrating a substrate having zigzag-patterned slant portions of a fifth embodiment of an optical semiconductor apparatus according to the present invention.
Figure 8B:
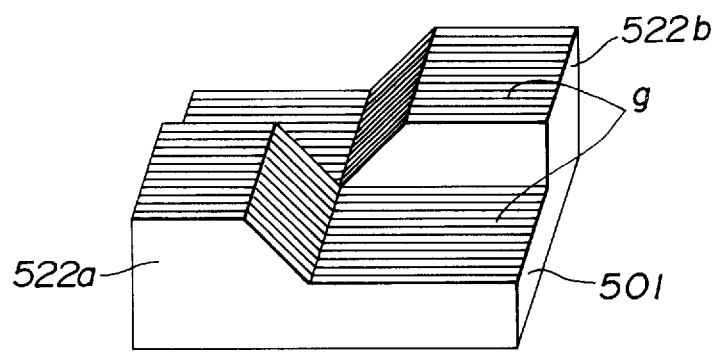
FIG. 8B is a perspective view illustrating the substrate having a diffraction grating of the fifth embodiment.

A fifth embodiment of the present invention, which resembles the DFB semiconductor laser apparatus of the fourth embodiment, will be described with reference to FIGS. 8A–8C. The fifth embodiment is fabricated in a manner different from the fourth embodiment.

An InGaAs/InP series DFB laser of the fifth embodiment is fabricated as follows. FIG. 8A shows an n-type InP substrate 501 on which zigzag-patterned steps 522a and 522b are formed by photolithography and wet etching, similar to the above embodiments. Similar to the first embodiment, a (001) substrate 501 is used, the cavity direction is a $[1\bar{1}0]$ direction and {111}A faces are exposed at the respective slant faces of the steps 522a and 522b.

Then, a grating pattern is formed on the wafer using a two-beam interference exposure method, and a grating g is formed by dry etching. The grating pitch is 240 nm (see FIG. 8B).

Figure 8C:
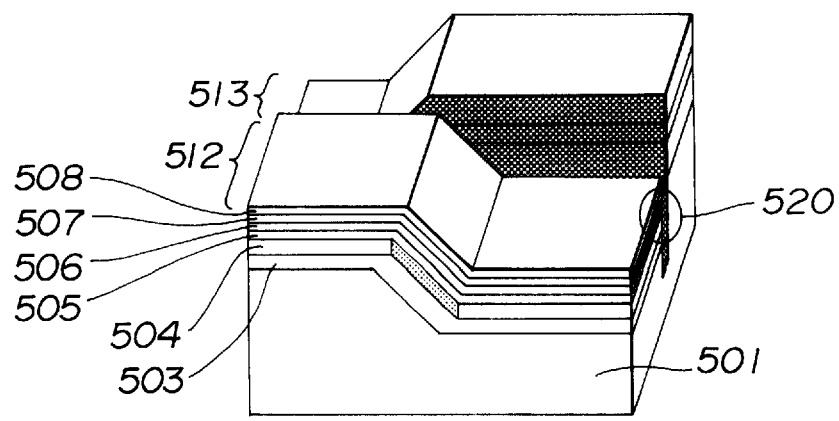
FIG. 8C is a perspective view illustrating the entire structure of the fifth embodiment.

FIG. 8C illustrates a perspective aspect of the laser structure. An Sn-doped n-type $In_{0.86}Ga_{0.14}As_{0.31}P_{0.69}$ lower clad layer 503 having a thickness of 0.1 $\mu$m, an active layer 504 of a quantum well structure, a Be-doped, p-type $In_{0.73}Ga_{0.27}As_{0.59}P_{0.41}$ upper light guide layer 505 having a thickness of 0.15 $\mu$m, an Si-doped $In_{0.86}Ga_{0.14}As_{0.31}P_{0.69}$ carrier confining layer 506 having a thickness of 0.3 $\mu$m (this Si-doped layer (Si is an amphi-conductive impurity) exhibits p-type on the slant faces and n-type on the flat faces, and thus a current restraint structure is constructed), a Be-doped p-type InP clad layer 507 and a p-type $In_{0.59}Ga_{0.41}As_{0.9}P_{0.1}$ contact layer 508 are deposited on the substrate 501. The active layer 504 having the quantum well structure consists of five pairs of intrinsic (i-) $In_{0.53}Ga_{0.47}$ well layers (thickness: 6 nm) and $In_{0.73}Ga_{0.27}As_{0.59}P_{0.41}$ barrier layers (thickness: 10 nm).

Similar to the above embodiments, ohmic electrodes (not shown) are formed on upper and lower surfaces of the wafer, and a groove 520 is formed for electrode separation. Thus, an oscillation polarization mode selective DFB laser is built. This is a two-electrode DFB laser in which respective current-injection electrodes are formed on a front portion 512 and a rear portion 513. Also in the DFB laser apparatus of this embodiment, the following technical advantages are attained by the introduction of the grating g. The line width of oscillation wavelength is narrowed. Oscillation wavelength is further stabilized. Wavelength tuning is readily performed as a wavelength tunable laser apparatus.

Sixth Embodiment

Figure 9A:
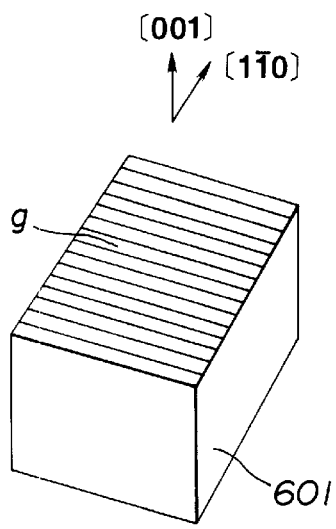
FIG. 9A is a perspective view illustrating a substrate having a diffraction grating thereon of a sixth embodiment of an optical semiconductor apparatus according to the present invention.
Figure 9B:
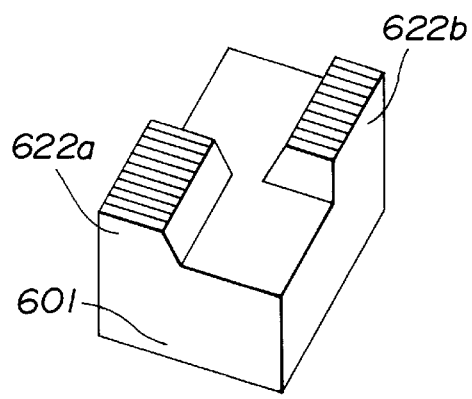
FIG. 9B is a perspective view illustrating a substrate having zigzag-patterned slant portions of the sixth embodiment.

A sixth embodiment of the present invention, which is directed to an InGaAs/InP series DFB semiconductor laser apparatus, will be described with reference to FIGS. 9A–9D. FIG. 9A shows a (001) n-type InP substrate 601 on which a grating pattern is formed by a two-beam interference exposure method and a grating g is formed by dry etching. The grating pitch is 240 nm.

Zigzag-patterned steps 622a and 622b are formed by photolithography and wet etching, similar to the above embodiments. The cavity direction is a $[1\bar{1}0]$ direction and {111}A faces are exposed at the respective slant faces of the steps 622a and 622b (see FIG. 9B).

Figure 9C:
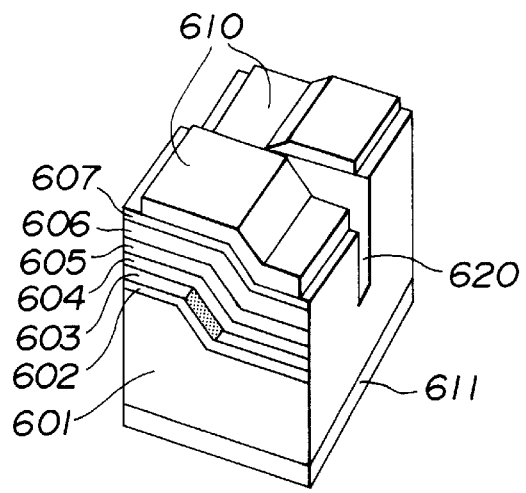
FIG. 9C is a perspective view illustrating the entire structure of the sixth embodiment.

FIG. 9C illustrates a perspective aspect of the laser structure. An Sn-doped n-type $In_{0.86}Ga_{0.14}As_{0.31}P_{0.69}$ lower light guide layer 602 having a thickness of 0.1 m, an active layer 603 of a quantum well structure, a Be-doped, p-type $In_{0.73}Ga_{0.27}As_{0.59}P_{0.41}$ upper light guide layer 604 having a thickness of 0.15 $\mu$m, an Si-doped $In_{0.86}Ga_{0.14}As_{0.31}P_{0.69}$ carrier confining layer 605 having a thickness of 0.3 $\mu$m (this Si-doped layer (Si is an amphi-conductive impurity) exhibits p-type on the slant faces and n-type on the flat faces, and thus a current restraint structure is constructed), a Be-doped p-type InP clad layer 606 and a p-type $In_{0.59}Ga_{0.41}As_{0.9}P_{0.1}$ contact layer 607 are laid down on the substrate 601. The active layer 603 having the quantum well structure consists of five pairs of intrinsic (i-) $In_{0.53}Ga_{0.47}As$ well layers (thickness: 6 nm) and $In_{0.73}Ga_{0.27}As_{0.59}P_{0.41}$ barrier layers (thickness: 10 nm).

Figure 9D:
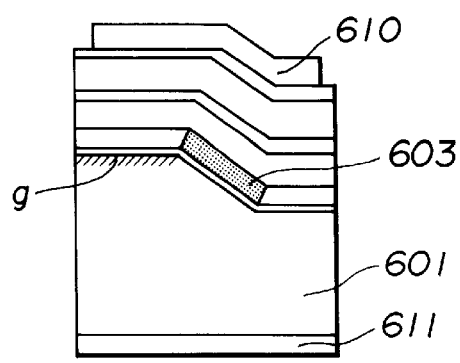
FIG. 9D is a cross-sectional view illustrating the the positional relation between the diffraction grating and an active layer of the sixth embodiment.

Similar to the above embodiments, ohmic electrodes 610 and 611 are deposited on upper and lower surfaces, and a groove 620 is formed for electrode separation. Thus, an oscillation polarization mode selective DFB laser is fabricated (see FIG. 9C). As illustrated in FIG. 9D, in this embodiment, the region of the grating g (a hatched portion) is located beside the active layer 603 on the slant face of the semiconductor laser apparatus. Therefore, the coupling coefficient of the grating g is relatively small, but the grating g can be readily formed since the two-beam interference exposure method is conducted on the flat surface of the substrate 601 without any uneven surfaces as illustrated in FIG. 9A.

Also in the DFB laser apparatus of this embodiment, the following technical advantages are obtained by the introduction of the grating g. The line width of oscillation wavelength is narrowed. Oscillation wavelength is highly stabilized. Wavelength tuning is readily performed as a wavelength tunable laser apparatus.

Seventh Embodiment

Figure 10A:
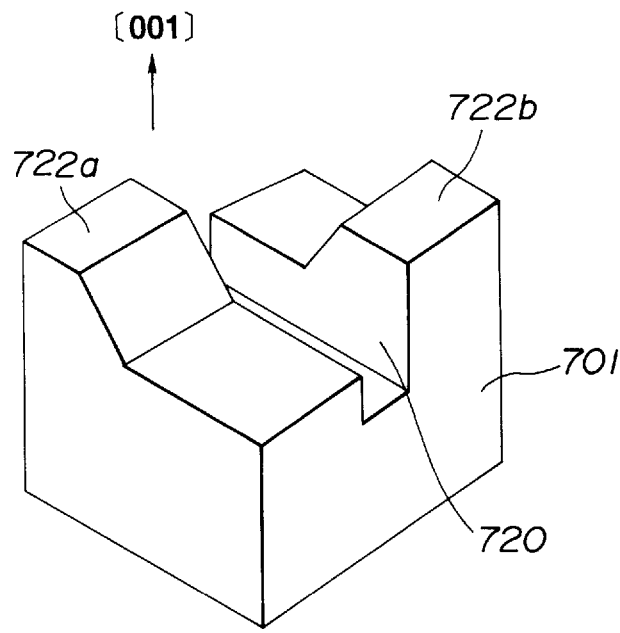
FIG. 10A is a perspective view illustrating a substrate having zigzag-patterned slant portions and a groove therebetween of a seventh embodiment of an optical semiconductor apparatus according to the present invention.

A seventh embodiment of the present invention, which is directed to an AlGaAs/GaAs series semiconductor optical amplifier apparatus, will be described with reference to FIGS. 10A and 10B. FIG. 10A shows a (001) n-type GaAs substrate 701 on which zigzag-patterned forward-mesa steps 722a and 722b are formed by photolithography and wet etching in the same manner as the above embodiments. The etching depth is 1.8 $\mu$m, and the slant faces of the steps 722a and 722b are Ga-stabilized surfaces which are {111}A faces each inclined by 55 degrees from the (001) face. A groove 720 having a depth of 3 $\mu$m and a width of 20 $\mu$m is formed on the substrate 701 by combination of patterning by photolithography and dry etching. FIG. 10A shows a wafer with the groove 720 on which epitaxial growth is to be performed afterward.

On the wafer, laser structures are grown using a crystal growth method of CBE method. Specifically, as shown in FIG. 10B, an Sn-doped n-type $Al_{0.6}Ga_{0.4}As$ lower clad layer 702 having a thickness of 1.3 $\mu$m, an active layer 703 of a quantum well structure, a Be-doped p-type $Al_{0.3}Ga_{0.7}As$ upper light guide layer 704 having a thickness of 0.15 µm, an Si-doped $Al_{0.6}Ga_{0.4}As$ carrier confining layer 705 (Si (an amphi-conductive impurity) exhibits p-type on the slant face and n-type on the flat surface, and hence the Si-doped layer can form a current restraint structure) having a thickness of 0.2 µm, a Be-doped p-type $Al_{0.6}Ga_{0.4}As$ upper clad layer 706 having a thickness of 1.8 µm, and a Be-doped p-type GaAs contact layer 707 having a thickness of 0.3 µm are laid down on the substrate 701 in the named order. The active layer 703 having the quantum well structure consists of five pairs of intrinsic (i-) GaAs well layers (thickness: 8 nm) and $Al_{0.3}Ga_{0.7}As$ barrier layers (thickness: 20 nm).

Similar to the third embodiment, light propagated through the slant face portions 722a and 722b on opposite sides is transmitted chiefly through the p-type AlGaAs upper clad layer 706 in the groove portion 720, and light loss at the groove portion 720 is reduced.

Figure 10B:
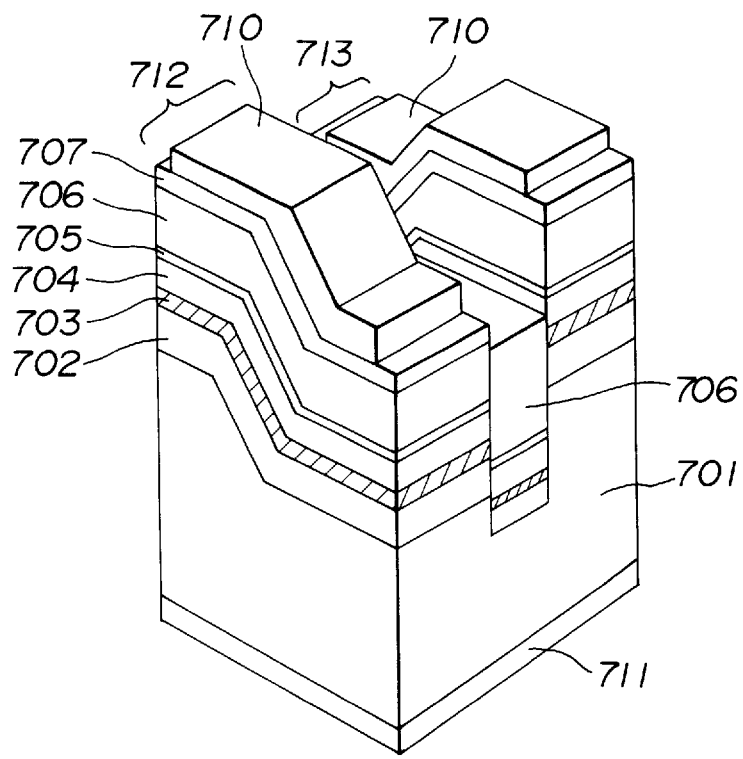
FIG. 10B is a perspective view illustrating the entire structure of the seventh embodiment.

Then, as shown in FIG. 10B, ohmic electrodes 710 and 711 for injecting current below its threshold therethrough are deposited on upper and lower surfaces of the wafer, and the upper electrode 710 is separated into two portions. Further, end facets are formed by cleavage. Cavity lengths of a front portion 712 and a rear portion 713 are approximately equal. On the end facets, antireflection coatings of $SiO_2$ (not shown) are deposited.

In the optical amplifier apparatus of the seventh embodiment, the inclination of the slant face in the first resonator portion 712 is different from that in the second resonator portion 713. Two {111}A faces of the first resonator portion 712 and the second resonator portion 713 are inclined relative to each other by about 70 degrees, so that electric field directions of the TE mode, whose gain is larger in the quantum well layer 703, form an angle of 70 degrees between the front portion 712 and the rear portion 713. Therefore, the TE-mode light in the front portion 712 couples more to the TM-mode light in the rear portion 713, and the TM-mode light in the front portion 712 couples more to the TE-mode light in the rear portion 713.

Thus, the polarization-mode directions, in which gains are large in the two resonators of the front portion 712 and the rear portion 713, are inclined relative to each other. As a result, the polarization mode dependency of gain is noticeably reduced for light incident through the end facet coated with the antireflection coating.

Eighth Embodiment

An optical semiconductor apparatus of the present invention is not limited to a two-electrode device with two slant face portions. An eighth embodiment of the present invention is directed to a three-electrode semiconductor laser apparatus.

Figure 11A:
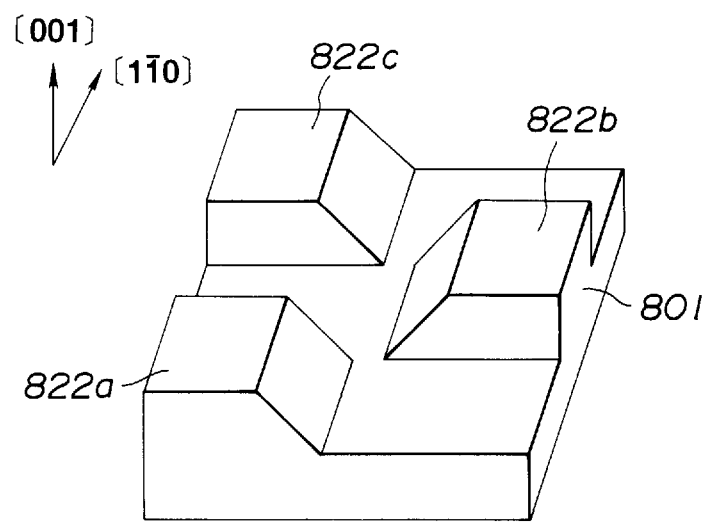
FIG. 11A is a perspective view illustrating a substrate having zigzag-patterned three slant portions of an eighth embodiment of an optical semiconductor apparatus according to the present invention.

FIG. 11A shows an n-type GaAs substrate 801 on which zigzag-patterned steps 822a, 822b and 822c are formed by photolithography and wet etching, similar to the above embodiments. Similar to the first embodiment, a (001) substrate 801 is used, the cavity direction is a [1$\bar{1}$0] direction and {111}A faces are exposed at the respective slant faces of the steps 822a, 822b and 822c. The length in the [1$\bar{1}$0] direction of the central slant face portion 822b is set to 100 µm.

Figure 11B:
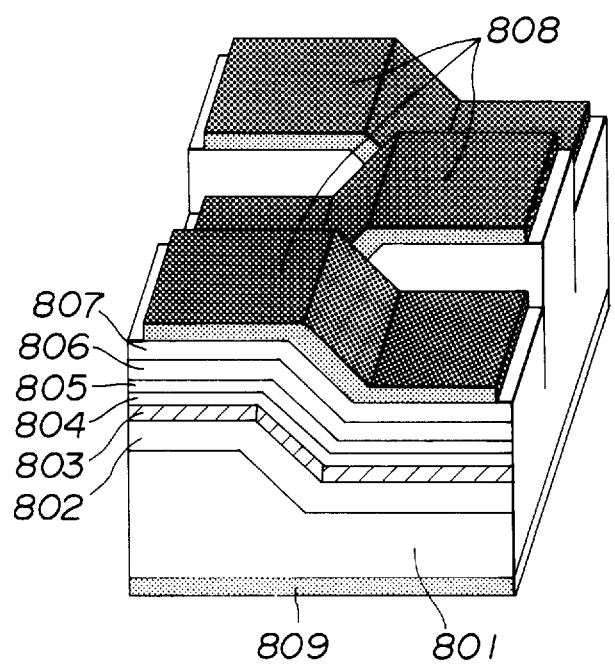
FIG. 11B is a perspective view illustrating the entire structure of the eighth embodiment.

On the wafer, laser structures are grown using a crystal growth method. Specifically, as shown in FIG. 11B, an Sn-doped n-type $Al_{0.6}Ga_{0.4}As$ lower clad layer 802 having a thickness of 1.3 µm, an active layer 803 of a quantum well structure, a Be-doped p-type $Al_{0.3}Ga_{0.7}As$ upper light guide layer 804 having a thickness of 0.15 µm, an Si-doped $Al_{0.6}Ga_{0.4}As$ carrier confining layer 805 (Si (an amphi-conductive impurity) exhibits p-type on the slant face and n-type on the flat surface, and hence the Si-doped layer can form a current restraint structure) having a thickness of 0.3 µm, a Be-doped p-type $Al_{0.6}Ga_{0.4}As$ upper clad layer 806, and a p-type GaAs contact layer 807 are laid down on the substrate 801 in the named order. The active layer 803 having the quantum well structure consists of five pairs of intrinsic (i-) GaAs well layers (thickness: 6 nm) and $Al_{0.3}Ga_{0.7}As$ barrier layers (thickness: 10 nm).

Then, as shown in FIG. 11B, ohmic electrodes 808 and 809 are deposited on upper and lower surfaces of the wafer, and the upper electrode 808 is separated into three portions. Further, end facets are formed by cleavage. Thus, a polarization mode selective semiconductor laser apparatus or a polarization mode insensitive semiconductor optical amplifier apparatus is constructed. This embodiment has a three-electrode structure, so that wavelength tuning, stabilization of intensity of output light or the like can be readily performed by appropriately controlling amounts of currents injected through the respective electrodes.

Ninth Embodiment

A ninth embodiment of the present invention is directed to a two-electrode semiconductor laser apparatus with a current restraint structure which includes a layer grown while simultaneously supplying n-type and p-type dopants.

Figure 12A:
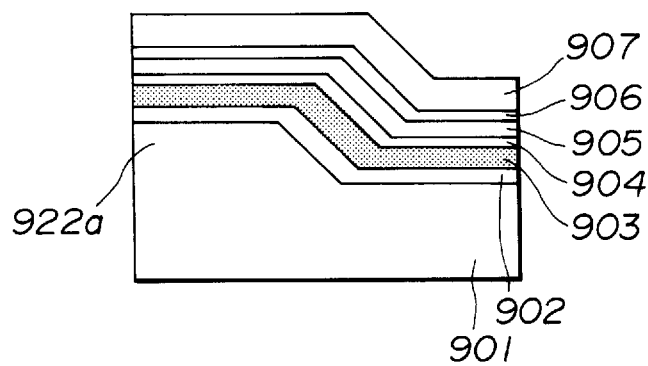
FIG. 12A is a cross-sectional view illustrating a layer structure of a ninth embodiment of an optical semiconductor apparatus according to the present invention.
Figure 12B:
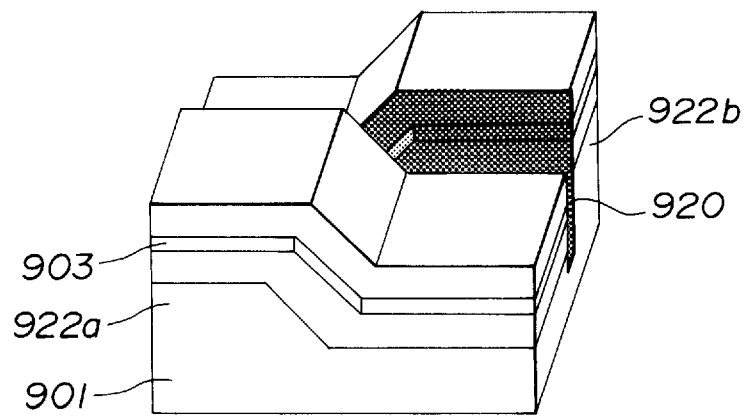
FIG. 12B is a perspective view illustrating the entire structure of the ninth embodiment.

FIG. 12B shows an AlGaInP series semiconductor laser apparatus formed on an n-type GaAs substrate 901. A n-type GaAs (001) substrate 901 is used, and zigzag-patterned steps 922a and 922b are formed on the substrate 901 by photolithography and wet etching. The cavity direction is a [1$\bar{1}$0] direction and {111}A faces are exposed at the respective slant faces of the steps 922a and 922b. In FIG. 12A, reference numeral 902 designates an n-type AlGaInP lower clad layer, reference numeral 903 designates an undoped GaInP active layer, reference numeral 904 designates an AlGaInP current restraint layer, reference numeral 905 designates a p-type AlGaInP upper clad layer, reference numeral 906 designates an AlGaInP current restraint layer, and reference numeral 907 designates a p-type GaAs contact layer.

Those layers are deposited in the following manner. Initially, the Se-doped n-type AlGaInP lower clad layer 902 and the undoped GaInP active layer 903 are laid own by a well-known MOCVD method. Then, the AlGaInP current restraint layer 904 is deposited while supplying Zn and Se simultaneously. On the (001) flat face portions, an n-type AlGaInP is formed, and on the {111}A slant faces, a p-type AlGaInP is formed. Further, the supply of Se is stopped and the flow amount of Zn is increased to form the p-type AlGaInP upper clad layer 905. Next, Zn and Se are simultaneously supplied once again to lay down the AlGaInP current restraint layer 906. Finally, the p-type GaAs contact layer 907 is formed while supplying only Zn.

Electrodes are formed on upper and lower surfaces of the wafer, and a groove 920 is formed to devide the upper electrode and device portions. End facets are formed by cleavage, and thus an oscillation polarization mode selective semiconductor laser apparatus is constructed.

In this embodiment, the layer thicknesses on the slant faces are greater than the layer thicknesses on the flat face portions, and the refractive-index propagation is performed for light. This point of this embodiment is different from the embodiments in which MBE series growth methods are conducted.

Tenth Embodiment

A tenth embodiment will now be described with reference to FIGS. 13 and 14. The tenth embodiment is directed to an optical local area network (LAN) system or a wavelength division multiplexing optical LAN system using a light source including an oscillation polarization mode selective laser apparatus of the present invention. FIG. 14 illustrates an opto-electric converting unit (node), which is connected to a terminal of the optical LAN system shown in FIG. 13.

Figure 13:
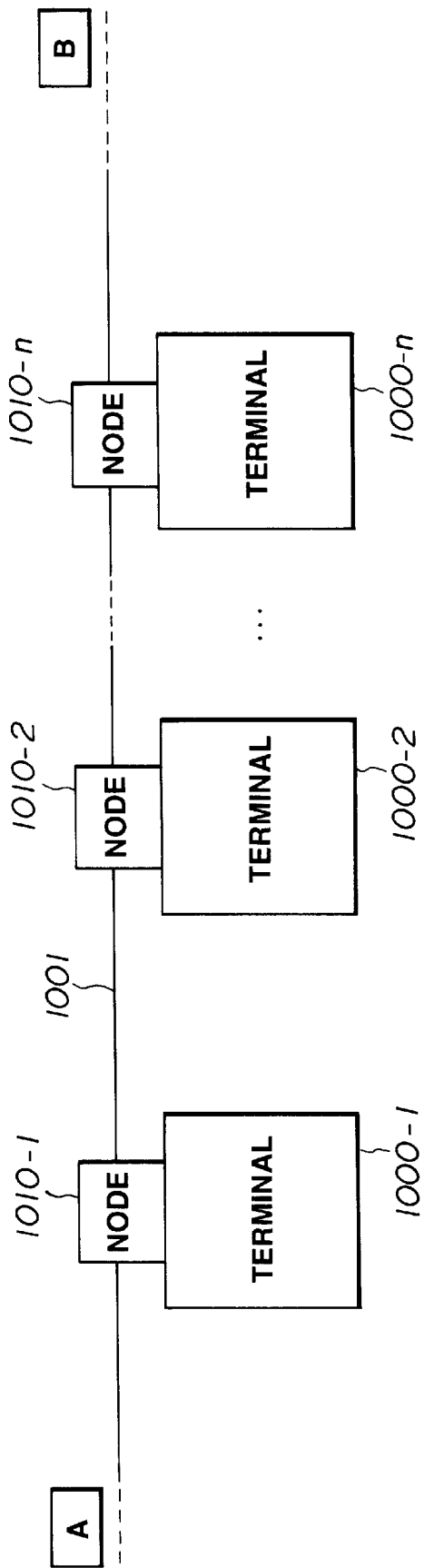
FIG. 13 is a block diagram illustrating an optical LAN system using an optical semiconductor apparatus of the present invention.
Figure 14:
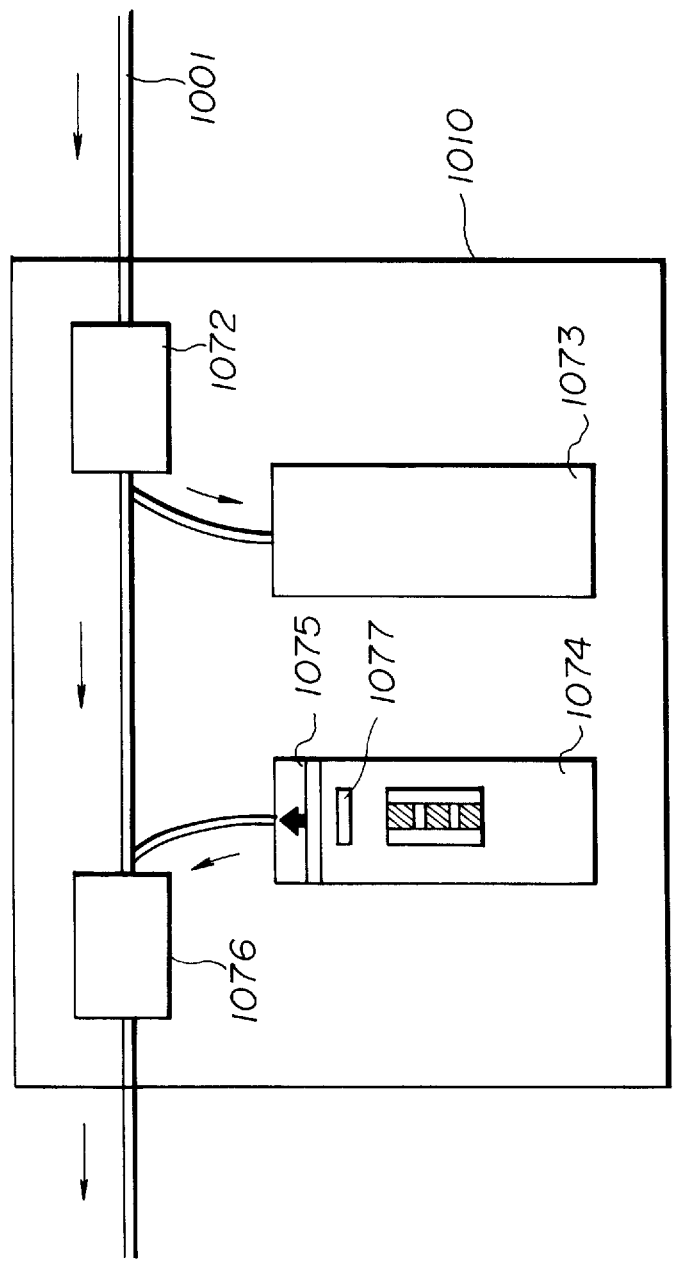
FIG. 14 is a block diagram illustrating a node used in the optical LAN system of FIG. 13.

In the bus-type network shown in FIG. 13, multiple terminals 1000-1, 1000-2, . . . , 1000-n are respectively connected to an optical fiber 1001 through nodes 1010-1, 1010-2, . . . , 1010-n along a direction A-B.

In FIG. 14, a light signal is taken into the node 1010 through the optical fiber 1001, and a portion of the signal is input into an optical receiver 1073 by a branching device 1072. The optical receiver 1073 includes a tunable optical filter and a photodetector, and only signal light at a desired wavelength is taken out from the incident signal light, and the signal is detected.

On the other hand, when a light signal is transmitted from the node 1010, signal light from an oscillation polarization mode selective semiconductor laser apparatus 1074 of the present invention is input into the optical fiber 1001 at a combining portion 1076 through a polarizer 1077 and an isolator 1075. The laser apparatus 1074 is driven by a method described in the above embodiments, and a polarization-modulated light wave emitted from the laser apparatus 1074 is converted to an intensity-modulated light output by the polarizer 1077.

A plurality of tunable optical filters and semiconductor laser apparatuses may be arranged in a node to widen the wavelength tunable range. Further, two nodes may be connected to each terminal and two optical fibers may be provided to accomplish bi-directional transmission of a DQDB system.

In such an optical network system, when the driving method and the optical transmission system of the present invention are used, a high-density wavelength or optical frequency division multiplexing network can be constructed.

As a network, a loop type, which is constructed by connecting A and B in FIG. 13, a star type, a loop type or a compound configuration thereof may be used.

Eleventh Embodiment

Figure 15:
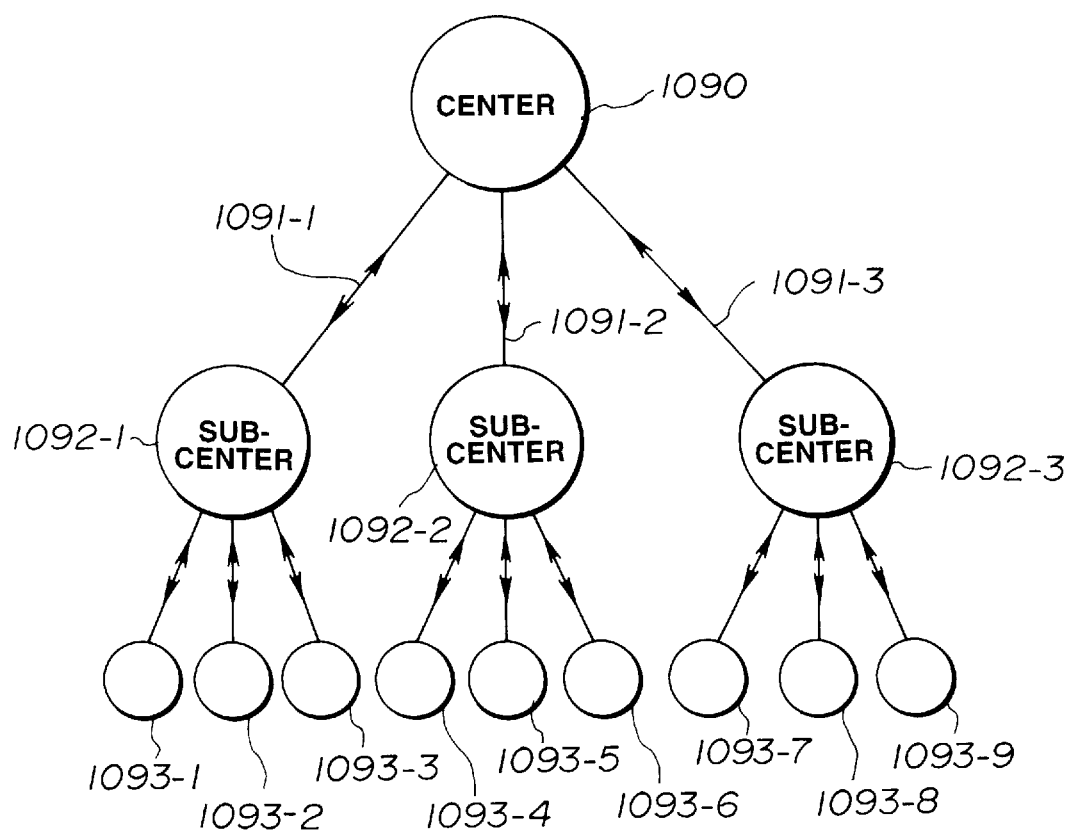
FIG. 15 is a block diagram illustrating an optical CATV system using an optical semiconductor apparatus of the present invention.

A bi-directional optical CATV system, as shown in FIG. 15, can be constructed using an oscillation polarization mode selective semiconductor laser apparatus of the present invention. In FIG. 15, reference numeral 1090 is a CATV center, reference numerals 1092-1, 1092-2 and 1092-3 are respectively sub-centers connected to the center 1090 by optical fibers 1091-1, 1091-2 and 1092-3, and reference numerals 1093-1, 1093-2, . . . , 1093-9 are respectively receivers of subscribers connected to the sub-centers 1092-1, 1092-2 and 1092-3. In the center 1090, a light source apparatus or tunable laser of the present invention is polarization-modulated by a driving method described in the above embodiments, and a plurality of video signals are carried on signal light of different wavelengths to transmit the signals to the receivers 1093-1, 1093-2, . . . , 1093-9. Each receiver includes a tunable wavelength filter and a photodetector, and only signal light at a desired wavelength of input signal light is detected to reproduce a picture image on a monitor. On the subscriber side, the transmission wavelength of the tunable filter is changed to select a desired channel. Thus, a desired picture image can be obtained. Conventionally, it was difficult to use such a DFB filter in that system due to dynamic wavelength fluctuation of a DFB laser. The present invention enables the use of such a DFB filter.

Further, a bi-directional CATV is possible in the following manner. Each of the receivers 1093-1, 1093-2, . . . , 1093-9 has an external modulator (for an example of a simple bi-directional optical CATV, see, for example, Ishikawa and Furuta "LiNbO$_3$ Optical Wavelength Modulator For Bi-directional Transmission in Optical CATV Subscriber Systems", OCS 91-82 1991), and a signal from the subscriber is received as a reflected light (reflected light of a signal light transmitted to the subscriber) from its external modulator. Thus, highly improved services can be obtained.

Except as otherwise disclosed herein, the various components shown in outline or block form in the Figures are individually well known in the optical semiconductor device and optical communication arts, and their internal construction and operation are not critical either to the making or using of this invention or to a description of the best mode of the invention.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the following claims.

What is claimed is:

1. An optical semiconductor apparatus comprising:
   a single substrate;
   at least two semiconductor laser portions each having a semiconductor laser structure, said semiconductor laser portions being serially arranged on said substrate in a light propagation direction and said semiconductor laser portions respectively including waveguides having active layers, and layer-extending planes of said waveguides partially overlapping and being non-parallel to each other; and
   current injection means for independently injecting currents into said at least two semiconductor laser portions.

2. An optical semiconductor apparatus according to claim 1, wherein said at least two semiconductor laser portions are formed on said substrate in a zigzag-patterned manner.

3. An optical semiconductor apparatus according to claim 1, wherein a compound cavity laser apparatus is constructed by said at least two semiconductor laser portions.

4. An optical semiconductor apparatus according to claim 1, wherein said optical semiconductor apparatus is constructed as a semiconductor laser apparatus.

5. An optical semiconductor apparatus according to claim 1, wherein said optical semiconductor apparatus is constructed as a semiconductor optical amplifier apparatus.

6. An optical semiconductor apparatus according to claim 1, wherein said substrate has a plurality of slant portions having different slant faces thereon and said waveguide is formed on each of said slant portions.

7. An optical semiconductor apparatus according to claim 6, wherein each of said slant faces of said substrate comprises a forward mesa face of zinc blende type III–V semiconductor compound crystal.

8. An optical semiconductor apparatus according to claim 7, wherein each of said semiconductor laser portions includes a current restraint structure for restraining current into a portion of said waveguide, and said current restraint structure includes a layer structure having a layer doped with an amphi-conductive impurity and restrains the current into the portion of said waveguide on said slant face.

9. An optical semiconductor apparatus according to claim 7, wherein each of said semiconductor laser portions includes a current restraint structure for restraining current into a portion of said waveguide, and said current restraint structure includes a layer structure having a layer grown while simultaneously supplying n-type and p-type dopants and restrains the current into the portion of said waveguide on said slant face.

10. An optical semiconductor apparatus according to claim 7, wherein each of said semiconductor laser portions includes a current restraint structure for restraining currents into a portion of said waveguide, and said current restraint structure includes a layer structure formed by proton-bombardment and restrains the current into the portion of said waveguide on said slant face.

11. An optical semiconductor apparatus according to claim 2, wherein said substrate comprises a {100} GaAs substrate, and wherein said optical semiconductor apparatus further comprises a forward mesa surface comprising a Ga-stabilized face.

12. An optical semiconductor apparatus according to claim 11, wherein said Ga-stabilized face comprises a {111}A face.

13. An optical semiconductor apparatus according to claim 2, wherein said substrate comprises a {110} GaAs substrate, and wherein said optical semiconductor apparatus further comprises a forward mesa surface comprising a {001} face.

14. An optical semiconductor apparatus according to claim 2, wherein said substrate comprises a {100} InP substrate, and wherein said optical semiconductor apparatus further comprises a forward mesa surface comprising a {111}A face.

15. An optical semiconductor apparatus according to claim 1, wherein each of said semiconductor laser portions includes a current restraint structure for restraining current into a portion of said waveguide.

16. An optical semiconductor apparatus according to claim 1, wherein said semiconductor laser portions are separated from each other by a groove, and said groove separates an electrode of said current injecting means into a plurality of portions.

17. An optical semiconductor apparatus according to claim 1, wherein said semiconductor laser portions are separated from each other by a groove, and said groove is buried with a semiconductor compound layer which has a band gap energy larger than photon energy of oscillated laser light.

18. An optical semiconductor apparatus according to claim 1, wherein said semiconductor laser portions respectively include diffraction gratings.

19. An optical semiconductor apparatus according to claim 18, wherein said grating is formed solely on a flat portion of said semiconductor laser portion.

20. An optical semiconductor apparatus according to claim 1, wherein said semiconductor laser portions form a compound cavity.

21. An optical communication method for transmitting a signal from a transmitter to a receiver through an optical transmission line, said method comprising the steps of:
modulating the polarization mode of light output from an optical semiconductor apparatus between two mutually-perpendicular polarization modes by controlling current injected into the optical semiconductor apparatus, the optical semiconductor apparatus comprising a single substrate; at least two semiconductor laser portions each having a semiconductor laser structure, said semiconductor laser portions being serially arranged on said substrate in a light propagation direction and respectively including waveguides having active layers, layer-extending planes of said waveguides partially overlapping and being non-parallel to each other; and current injection means for independently injecting currents into said at least two semiconductor laser portions;

selecting only the light output in one of the two mutually-perpendicular polarization modes to create an amplitude-modulated signal; and transmitting the amplitude-modulated signal through the optical transmission line.

22. An optical communication method according to claim 21, wherein the wavelength of the amplitude-modulated signal is tuned by controlling current injected into the optical semiconductor apparatus, and a signal at a desired wavelength is selectively detected by using a wavelength filter in the receiver.

23. An optical communication system for transmitting a signal from a transmitter to a receiver through an optical transmission line, said system comprising:
an optical semiconductor apparatus provided in the transmitter, a polarization mode of light output from said optical semiconductor apparatus being modulated between two mutually-perpendicular polarization modes by controlling current injected into said optical semiconductor apparatus, and said optical semiconductor apparatus comprising a single substrate; at least two semiconductor laser portions each having a semiconductor laser structure, said semiconductor laser portions being serially arranged on said substrate in a light propagation direction and respectively including waveguides having active layers, layer-extending planes of said waveguides partially overlapping and being non-parallel to each other; and current injection means for independently injecting currents into said at least-two semiconductor laser portions; and means for selecting only the light output in one of the two mutually-perpendicular modes so as to create an amplitude-modulated signal, the amplitude-modulated signal being the signal transmitted from the transmitter to the receiver through the optical transmission line.

24. An optical communication system according to claim 23, wherein said optical semiconductor apparatus changes the wavelength of the amplitude-modulated signal, and further comprising a wavelength filter provided in the receiver for selectively detecting the signal at a desired wavelength.

25. A light source apparatus comprising:
an optical semiconductor apparatus, a polarization mode of light output from said optical semiconductor apparatus being modulated between two mutually-perpendicular polarization modes by controlling current injected into said optical semiconductor apparatus, and said optical semiconductor apparatus comprising a single substrate; at least two semiconductor laser portions each having a semiconductor laser structure, said semiconductor laser portions being serially arranged on said substrate in a light propagation direction and respectively including waveguides having active layers, layer-extending planes of said waveguides partially overlapping and being non-parallel to each other; and current injection means for independently injecting currents into said at least two semiconductor laser portions; and means for selecting only the light output in one of the two mutually-perpendicular modes.

26. An optical semiconductor apparatus comprising:
a single substrate;

at least two semiconductor laser portions each having a semiconductor laser structure, said semiconductor laser portions being serially arranged on said substrate in a light propagation direction and said semiconductor laser portions respectively including waveguides having active layers, and layer-extending planes of said waveguides partially overlapping and being non-parallel to each other; and electrodes for independently injecting currents into said at least two semiconductor laser portions.

27. An optical semiconductor apparatus according to claim 26, wherein said semiconductor laser portions form a compound cavity.

28. An optical semiconductor apparatus comprising:

at least two semiconductor laser portions each having a semiconductor laser structure, said semiconductor laser portions being serially arranged in a light propagation direction and said semiconductor laser portions respectively including waveguides having active layers, and layer-extending planes of said waveguides being non-parallel to each other, and said semiconductor laser portions being arranged so that said semiconductor laser portions optically couple with each other; and current injection means for independently injecting currents into said at least two semiconductor laser portions.

29. An optical semiconductor apparatus according to claim 28, wherein said semiconductor laser portions form a compound cavity.

30. An optical semiconductor apparatus comprising:

at least two semiconductor laser portions each having a semiconductor laser structure, said semiconductor laser portions being serially arranged in a light propagation direction and said semiconductor laser portions respectively including waveguides having active layers, and layer-extending planes of said waveguides being non-parallel to each other, and said semiconductor laser portions being arranged so that said semiconductor laser portions optically couple work each other; and electrodes for independently injecting currents into said at least two semiconductor laser portions.

31. An optical semiconductor apparatus according to claim 30, wherein said semiconductor laser portions form a compound cavity.

* * * * *

UNITED STATES PATENT AND TRADEMARK OFFICE
CERTIFICATE OF CORRECTION

PATENT NO. : 5,822,352

DATED : October 13, 1998

INVENTOR(S): NATSUHIKO MIZUTANI, ET AL.                    Page 1 of 2

It is certified that error appears in the above-identified patent and that said Letters Patent is hereby corrected as shown below:

TITLE PAGE:
Item [73] ASSIGNEE:

"Canon Kabushiki Kaisha, Japan" should read --Canon Kabushiki Kaisha, Tokyo, Japan--.

COLUMN 1:

Line 57, "satisfy" should read --satisfies-- and "take" should read --takes--.

COLUMN 9:

Line 3, "the the" should read --the--.

COLUMN 11:

Line 5, "remove" should read --removes--.

COLUMN 16:

Line 15, "0.1m," should read --0.1$\mu$m,--.

COLUMN 18:

Line 27, "A" should read --An--;
Line 43, "own" should read --down--; and
Line 55, "devide" should read --divide--.

UNITED STATES PATENT AND TRADEMARK OFFICE
CERTIFICATE OF CORRECTION

PATENT NO.   : 5,822,352
DATED        : October 13, 1998
INVENTOR(S)  : NATSUHIKO MIZUTANI, ET AL.

It is certified that error appears in the above-identified patent and that said Letters Patent is hereby corrected as shown below:

COLUMN 22:

Line 34, "least-two" should read --least two--.

COLUMN 23:

Line 17, "arranged" should read --arranged on a substrate--; and
    Line 23, "optically couple" should read --couple optically--.

COLUMN 24:

Line 10, "arranged" should read --arranged on a substrate--; and
    Line 16, "optically couple work" should read --couple optically with--.

Signed and Sealed this

Thirty-first Day of August, 1999

Attest:

Q. TODD DICKINSON

*Attesting Officer*      *Acting Commissioner of Patents and Trademarks*